(12) United States Patent
Gao et al.

(10) Patent No.: US 11,811,195 B2
(45) Date of Patent: Nov. 7, 2023

(54) METHOD FOR WAVELENGTH CONTROL OF SILICON PHOTONIC EXTERNAL CAVITY TUNABLE LASER

(71) Applicant: NeoPhotonics Corporation, San Jose, CA (US)

(72) Inventors: Yongkang Gao, Redwood City, CA (US); Jiann-Chang Lo, Cupertino, CA (US)

(73) Assignee: NeoPhotonics Corporation, San Jose, CA (US)

( * ) Notice: Subject to any disclaimer, the term of this patent is extended or adjusted under 35 U.S.C. 154(b) by 586 days.

(21) Appl. No.: 16/805,055

(22) Filed: Feb. 28, 2020

(65) Prior Publication Data
US 2020/0280173 A1    Sep. 3, 2020

Related U.S. Application Data

(60) Provisional application No. 62/812,455, filed on Mar. 1, 2019.

(51) Int. Cl.
*H01S 5/14* (2006.01)
*H01S 5/024* (2006.01)
(Continued)

(52) U.S. Cl.
CPC .............. *H01S 5/141* (2013.01); *H01S 3/137* (2013.01); *H01S 5/02415* (2013.01); *H01S 5/1007* (2013.01)

(58) Field of Classification Search
CPC ...... H01S 5/141; H01S 3/137; H01S 5/02415; H01S 5/1007; H01S 5/1032;
(Continued)

(56) References Cited

U.S. PATENT DOCUMENTS 6,040,938 A    3/2000 Ducellier
6,882,979 B1   4/2005 Reay et al.
(Continued)

OTHER PUBLICATIONS

Dong et al., "Thermally tunable silicon racetrack resonators with ultralow tuning power", Optics Express 2010, vol. 18 (19), 20298-20304.
(Continued)

*Primary Examiner* — Yuanda Zhang
(74) *Attorney, Agent, or Firm* — Harrity & Harrity, LLP

(57) ABSTRACT

A tunable solid state laser device are described comprising a semiconductor based gain chip and a silicon photonic filter chip with tuning capability. The silicon photonic filter chip can comprises an input-output silicon waveguide, at least two ring resonators formed with silicon waveguides, one or more connecting silicon waveguides interfacing with the ring resonators, a separate heater associated with each ring resonator, a temperature sensor configured to measure the chip temperature, and a controller connected to the temperature sensor and the separate heaters and programmed with a feedback loop to maintain the filter temperature to provide the tuned frequency. The one or more connecting silicon waveguides are configured to redirect light resonant with each of the at least two ring resonators back through the input-output silicon waveguide. Corresponding methods are described for the control of the laser frequency. Improved structures of the SiPho multiple filter chip involve a Zagnac interferometer.

23 Claims, 11 Drawing Sheets

(51) Int. Cl.
*H01S 5/10* (2021.01)
*H01S 3/137* (2006.01)

(58) Field of Classification Search
CPC .... H01S 3/1062; H01S 5/02325; H01S 5/142; H01S 5/0612; H01S 5/06206; H01S 5/02453; G02B 2006/12135
See application file for complete search history.

(56) References Cited

U.S. PATENT DOCUMENTS

| | | | |
|---|---|---|---|
| 7,447,393 | B2 | 11/2008 | Yan et al. |
| 7,961,374 | B2 | 6/2011 | Finot et al. |
| 8,462,823 | B2 | 6/2013 | Daiber et al. |
| 9,653,882 | B1* | 5/2017 | Zheng ................ H01S 5/142 |
| 9,778,493 | B1* | 10/2017 | Krishnamoorthy ..... H01S 5/142 |
| 10,038,301 | B1 | 7/2018 | Eggleston et al. |
| 2005/0052726 | A1 | 3/2005 | Nakagawaet et al. |
| 2005/0069261 | A1 | 3/2005 | Arayama |
| 2007/0230855 | A1 | 10/2007 | McDonald et al. |
| 2008/0267361 | A1 | 10/2008 | Collings et al. |
| 2009/0122817 | A1 | 5/2009 | Sato et al. |
| 2009/0314763 | A1 | 12/2009 | Chu et al. |
| 2010/0183312 | A1 | 7/2010 | Bolla et al. |
| 2014/0140363 | A1 | 5/2014 | Pezeshki et al. |
| 2015/0117491 | A1 | 4/2015 | Lee et al. |
| 2015/0162723 | A1 | 6/2015 | Daiber |
| 2015/0162990 | A1 | 7/2015 | Daiber et al. |
| 2016/0049767 | A1 | 2/2016 | Morton et al. |
| 2016/0161676 | A1 | 6/2016 | Morton et al. |
| 2019/0058306 | A1 | 2/2019 | Wen et al. |
| 2019/0097385 | A1 | 3/2019 | Blauvelt |
| 2019/0170944 | A1 | 6/2019 | Sodagar et al. |
| 2019/0341739 | A1* | 11/2019 | Loh ................ H01S 3/2383 |
| 2019/0386465 | A1 | 12/2019 | Hayakawa et al. |

OTHER PUBLICATIONS

Gao et al., "High-Performance Hybrid-Integrated Silicon Photonic Tunable Laser", OSA Digest, Mar. 2019.
Guan et al., "Widely-tunable, narrow-linewidth III-V/silicon hybrid external-cavity laser for coherent communication," Opt. Express 26, 7920-7933 (2018).
Melikayan et al., "Wavelength Stabilized Silicon/III-V Hybrid Laser", Proc. 42nd ECOC, p. 598-600, Sep. 2016.
Sato et al., "High Output Power and Narrow Linewidth Silicon Photonic Hybrid Ring-Filter External Cavity Wavelength Tunable Lasers," ECOC, PD2.3 (2014).
International Search Report from co-pending Application No. PCT/US2020/020495 dated Jun. 25, 2020.
Fujioka et al., "Compact and Low Power Consumption Hybrid Integrated Wavelength Tunable Laser Module Using Silicon Waveguide Resonators", Journal of Lightwave Technology, vol. 28 No. 21, p. 3115-3120, (Nov. 1, 2010).
Kobayashi et al., "Silicon Photonic Hybrid Ring-Filter External Cavity Wavelength Tunable Lasers", Journal of Lightwave Technology, vol. 33 No. 6, p. 1241-1246, (Mar. 15, 2015).
Search Report from corresponding European Patent Application No. 20765655 dated Nov. 21, 2022.

* cited by examiner

METHOD FOR WAVELENGTH CONTROL OF SILICON PHOTONIC EXTERNAL CAVITY TUNABLE LASER

CROSS REFERENCE TO RELATED APPLICATIONS

This application claims priority to U.S. provisional application 62/812,455 filed on Mar. 1, 2019 to Gao et al., entitled "Method For Wavelength Control Of Silicon Photonic External Cavity Tunable Laser", hereby incorporated herein by reference.

TECHNICAL FIELD OF THE INVENTION

The invention relates to hybrid external cavity lasers with a semiconductor gain chip, such as a III-V semiconductor diode structure and a silicon photonics based tunable filter chip interfaced with the gain chip to form a tunable laser cavity. The invention further relates to a silicon photonic chip for an external cavity laser with desired thermal control.

BACKGROUND OF THE INVENTION

Coherent optical communications systems are universally recognized as the chief way forward for internetworking for distances from a few hundred meters up to global. Coherent optical systems are being deployed in ever increasing numbers as increasing demand drives fiber-optic capacities to 100 Gbs/wavelength and higher. Coherent tunable lasers are a vital and enabling element of such networks. These are often just called "tunable lasers", but the operational requirements for these lasers are much more specific than that simple term implies. Although the tunability of these lasers is typically stated in terms of wavelength, it is often more revealing to express the behaviors in terms of optical frequency. The correlation is always governed by the simple equation frequency=(speed of light)/wavelength. So a laser that is approximately tunable between 1520-nm and 1570-nm (a typical range) is commensurately tunable between approximately 197-Thz and 191-THz (Thz=$10^{12}$ Hz). In order for such a tunable laser to meet the requirements of emerging and forthcoming coherent systems, among many other requirements it should: (A) respond to a frequency setting (hence wavelength) within 1 GHz of the target (i.e., about 1 part in 200,000); and (B) exhibit a linewidth of less than 500 KHz, preferably less than 100 KHz (fractional bandwidth of about 1 part per billion).

In order to achieve these behaviors, the tunable laser invariably is designed as an external cavity laser (ECL). This means that the ECL structure comprises an optical amplifying element and other optical elements forming a compound optical resonator. This is in contrast to a standard semiconductor laser diode wherein the amplifying element and optical resonator are essentially one in the same on a single die. Optical filters within the compound optical cavity are adjusted to select the intended optical frequency and hold the required optical linewidth. A single optical filter that could tune a single passband across the entire 6-THz (or so) tuning range and also provide the 200-KHz (or so) linewidth is not presently practical (or even closely so). Hence, practical ECL tunable lasers of this sort utilize two tunable filters in the compound resonator. Each of the tunable filters provides a comb of narrow passbands across the tuning range, and each filter is independently adjusted such that there is only overlap between one line of each filter, and the tunable laser emits narrowband light at that overlapping frequency.

SUMMARY OF THE INVENTION

In a first aspect, the invention pertains to a tunable solid state laser device comprising a semiconductor based gain chip, and a silicon photonic filter chip with tuning capability. Generally, the silicon photonic filter chip comprises an input-output silicon waveguide, at least two ring resonators formed with silicon waveguides, one or more connecting silicon waveguides interfacing with the ring resonators, a separate heater associated with each ring resonator, a temperature sensor configured to measure the chip temperature, and a controller connected to the temperature sensor and the separate heaters and programmed with a feedback loop to maintain the filter temperature to provide the tuned frequency. Within the silicon photonics chip, the one or more connecting silicon waveguides generally are configured to redirect light resonant with each of the at least two ring resonators back through the input-output silicon waveguide. In some embodiments, the input-output silicon waveguide of the silicon photonic filter chip is coupled to the semiconductor based gain chip with a spot size convertor to provide for mode size matching to reduce loss due to the interface.

In a further aspect, the invention pertains to a method to stabilize output of a tunable external cavity laser, in which the tunable external cavity laser comprises a semiconductor based gain chip and a silicon photonic filter chip that are coupled to each other with a spot size converter to form the laser cavity. In some embodiments, the silicon photonic filter chip comprises a resistance temperature sensor configured to measure chip temperature away from any heating elements and a plurality of ring resonators with separate integrated resistance heaters. The method can comprise using a control loop driven with a controller configured to obtain readings from the resistance temperature sensor and to adjust power to resistance heaters to maintain laser frequency within tolerances.

In another aspect, the invention pertains to an optical chip comprising:
  an input waveguide;
  a Sagnac interferometer optically connected to the input waveguide, comprising:
    a splitter/coupler connected to the input waveguide;
    two waveguide branches connected to the splitter-coupler and that each terminate at an end;
    two ring resonators each coupled to a separate waveguide branch and to each other through an intervening curved waveguide to invert the direction of optical rotation in the respective ring resonators, wherein the intervening curved waveguide may or may not comprise a further ring resonator; and
    a resistance heater associated with each ring resonator,
  in which light into the input waveguide is split into a particular waveguide branch and is then coupled through one ring resonator, along the intervening curved waveguide and through the other ring resonator into the opposite waveguide branch back toward the splitter-coupler if the light is in resonance with the two ring resonators and any intervening ring resonators. In some embodiments, the optical chip is implemented with silicon waveguides and silica cladding such that the optical chip can be considered a silicon photonics chip.

DETAILED DESCRIPTION OF THE INVENTION

Figure 1:
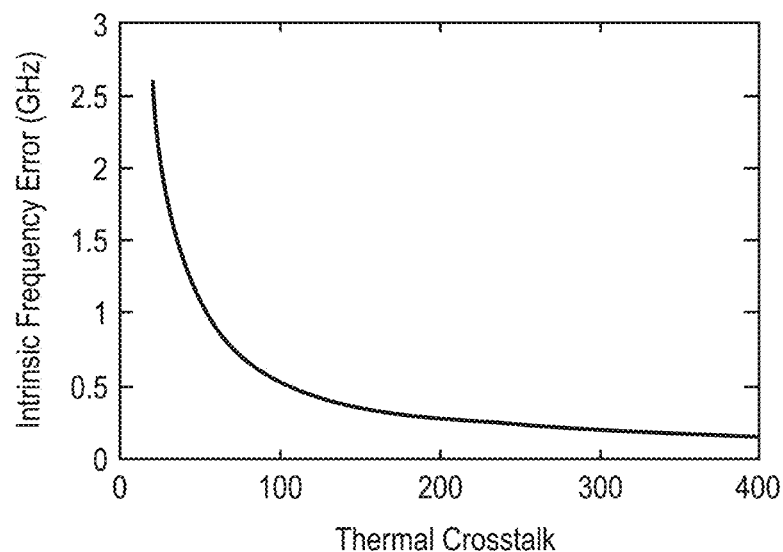
FIG. 1 is a plot of calculated extra frequency error of a silicon photonics base external cavity laser (ECL) comparing to a current commercial ECL as a function of different thermal crosstalk level.

External cavity tunable lasers are presented with integral silicon photonics tuning sections of the laser cavity using tight control of temperature of a silicon photonic filter chip to provide for small drift of the laser frequency. The frequency tuning of the external cavity lasers is performed using a photonic chip with silicon waveguides forming optical filters that are adjustable using resistance heaters. To achieve a desired frequency control and tunability over a desired range, the filters can comprise at least two ring resonators that are separately adjustable. The gain portion of the laser cavity can generally be formed using semiconductor waveguides, such as III-V semiconductor material. In some embodiments, the laser is directly interfaced with a semiconductor optical amplifier to amplify the laser output such that the optical power in the laser cavity can be maintained lower to provide for better laser control. The silicon photonics chip can incorporate a Sagnac interferometer structure (with the signal passing through the at least two resonant ring waveguides connecting the two waveguide branches to close the interferometer loop. The rings can be tuned to provide a selected wavelength and the multi-filtered Sagnac interferometer providing improved stability along with the frequency filtering. The structures described herein are designed for efficient commercialization using realistic designs and possibly the ability to leverage existing commercial components.

The explosive growth of network traffic driven by video-on-demand, mobile, and cloud-based services has accelerated the penetration of high-capacity coherent transmission systems from long-haul into metro and inter-datacenter networks. These shorter-reach network segments are particularly sensitive to the module cost, size, and power consumption, as described in N. Kaneda et al., "400 Gb/s Single Carrier Transmission with Integrated Coherent Optics," OFC, Th3F.4 (2016), incorporated herein by reference. Therefore, low-cost compact tunable lasers in small form-factor coherent modules, such as OSFP and DD-QSFP standard form factors, are in high demand. Meanwhile, high laser output power of 16 dBm and beyond is desirable for sharing between the light source and the local oscillator. Sub-100 kHz narrow linewidth is also preferred to meet the tight phase noise tolerance of high-order modulation formats. These commercial demands are described further in M. Seimetz et al., "Laser Linewidth Limitations for Optical Systems with High-Order Modulation Beyond 16-QAM," OFC, TH1B.1 (2008), incorporated herein by reference.

Disclosed herein are techniques, structures, and methods for accurate frequency control, and in some embodiments phase control, of tunable lasers using photonic integrated circuits in high-performance coherent modules for telecommunications and other applications. The tunable laser generally comprises a compound semiconductor material as the gain medium and a silicon photonic integrated circuit as the tunable frequency filter. The silicon photonic circuit generally comprises silicon waveguide ring resonators as frequency selective elements. The silicon photonic circuit can further include multiple integrated heaters, temperature sensors, reference temperature sensors, thermal isolation trenches and various combinations thereof, to accurately tune and monitor the filter frequencies of silicon waveguide ring resonators. The accurate monitoring and control of the properties of the frequency selective elements, e.g. resonant frequencies, can ensure frequency control of the tunable laser with high accuracy and long-term stability. In some embodiments, the silicon photonics filter comprises a multi-filtered Sagnac interferometer where two or more ring resonators connect two waveguide branches to form a loop of the interferometer and provide for reflection of the resonance frequency.

External cavity tunable lasers in a small form factor are one of the key enabling components for high-capacity coherent optical communication systems to meet the ever increasing bandwidth demand. External cavity tunable lasers include two fundamental elements. The first element is a gain medium, generally using III-V compound semiconductors such as indium phosphide (InP) and gallium arsenide because of their direct energy bandgap and high efficiency at light generation. The second element is a frequency selective external resonating cavity. The external laser cavity ensures significantly long resonating cavity to suppress the laser phase noise, which is extremely important in high-speed coherent communication systems as they rely on not only amplitude modulation but also optical phase modulations.

External cavity lasers using silicon photonics technology are a promising solution to reduce the size and cost of tunable lasers. Silicon integrated circuits has been the focus of electronics industry over the last a few decades, and their technology advancement has led to a significant reduction in feature size, cost, and power consumption of the complementary metal oxide semiconductor CMOS circuits. Photonic integrated circuits promises similar low-cost and high-volume manufacturing through the adoption of mature CMOS foundries developed in electronics industry. The single-chip integration of discrete optical components of tunable laser, such as frequency selective elements, power monitoring photo diodes, and optical splitters, can lower the tunable laser cost through reducing the number of discrete components and through less-complex assembly.

One of the fundamental features for tunable lasers in coherent communication systems is the highly accurate frequency control and long-term frequency stability. The filtering frequencies of the frequency selective elements can be tuned through the integrated micrometer-size heater next to them using the thermo-optic effect. However, due to the high thermal conductivity of the silicon material, the frequencies of the frequency selective elements on the silicon integrated circuits can be easily interfered by chip thermal disturbances, for example, from the ambient temperature changes, gain medium current variations, and the thermal cross-talks from other on-chip heaters. Thus, it is desirable to achieve improved methods and structures to accurately control the lasing frequency of external cavity tunable lasers using silicon photonic integrated circuits.

Diode lasers use a p-n junction to produce light generally when an electron and hole combine with the release of a photon corresponding to the energy release in which an electrical current pumps the excited electronic states with the electron-hole pairs. The laser cavity is formed through a rear reflector and a partial reflector at a front surface where the light is generated from the diode. The reflectance of light in the laser cavity results in the stimulated emission to yield the coherent laser light. For an internal cavity diode laser, the size of the laser cavity is set by the diode size. For external cavity diode lasers (ECL), the rear mirror is replaced by a photonic element that can allow for frequency tuning through adjustments of the laser cavity, while the gain region remains within the semiconductor diode. The improved designs herein use a silicon based photonic chip for adjustment of the laser cavity and correspondingly the laser frequency.

With the perpetual drive to decrease component size, new ECL architectures are being evaluated to achieve such size reductions. A significant path towards size reduction is to replace free-space sections of an ECL with waveguide integration. In particular, a thermally-tunable silicon-photonics ring resonator element is a reasonably direct analog for the thermally-tunable etalon in a free-space ECL. Thereby, a silicon-photonics waveguide chip having appropriately configured ring resonators can be a suitable integration of the free-space section of a conventional ECL, as described for instance in Melikyan (Melikyan et. al., "*Wavelength Stabilized Silicon/III-V Hybrid Laser,*" Proc. $42^{nd}$ ECOC 2016, pg 598, incorporated herein by reference). However, integrated photonics brings challenges as well as advantages. In particular, the thermal sensitivity of the silicon waveguides is substantially higher than for the optical path in the free-space etalons; and at the same time, the increased thermal conductivity of the common substrate and closer spacing of the integrated optical elements leads to much stronger thermal gradients across the optical elements. The thermal gradients and thermal sensitivities tend to spoil the weak-coupling assumptions for thermal effects from the free-space ECL to the degree that the silicon-photonics ECL generally have not been able to reliably meet all the performance requirements using the thermal-control technologies of the free-space ECL.

The external portions of the ECL cavities in the silicon photonic chips generally comprise two or more ring resonators in silicon waveguides. The ring resonators functions as optical filters selecting appropriate frequencies. The filters are generally temperature sensitive and are typically tuned by deliberately adjusting and controlling the temperature of each filter component. It is effectively impractical to directly measure the frequency transmission of a filter in these applications, but it is demonstrated that the transmission can be sufficiently inferred by monitoring the filter temperature and applying a mathematical calibration. It would be desirable to accurately know the temperature at the optical path through the filter. However, since both the heater and the temperature sensor would absorb light and should not be positioned too close to the optical path, the applied heat and sensed temperature are physically displaced from the optical path, and the actual temperature of the optical path is inferred. There are other thermal variations, such as changes in ambient temperature and temperature crosstalk between the filters, which can perturb the temperature inference. For free-space-based ECL, which has been the dominant architecture for existing commercial ECL, these couplings are weak and the resulting perturbations can be suppressed by thermal design and calibration enhancements. More information regarding etalon based ECL can be found for instance in U.S. Pat. No. 7,961,374 to Finot et al., entitled "thermal Control of Optical Filter With Local Silicon Frame," incorporated herein by reference.

External-cavity tunable lasers using silicon photonics technology are an attractive solution to meet these requirements. The general concepts of such laser designs are described in G. Valicourt et al., "Photonic Integrated Circuit Based on Hybrid III-V/Silicon Integration," J. Lightwave Technol. 36, 265-273 (2018), and A. Verdier et al., "Ultra-wideband Wavelength-Tunable Hybrid External-Cavity Lasers," J. Lightwave Technol. 36, 37-43 (2018), both of which are incorporated herein by reference. Their CMOS-compatible fabrication processes and the on-chip integration of various optical components show great promise to lower the cost and size of tunable laser devices, as described generally in A. Novack et al., "A Silicon Photonic Transceiver and Hybrid Tunable Laser for 64 Gbaud Coherent Communication," OFC, Th4D.4 (2018), and C. Doerr et al., "Silicon Photonics Coherent Transceiver in a Ball-Grid Array Package," OFC, paper Th5D.5 (2017), both of which are incorporated herein by reference. Moreover, the integration of a booster semiconductor optical amplifier (SOA) provides a clear path to compensate for the relatively high coupling and propagation losses of the silicon waveguide. The use of a SOA with an external cavity laser is described in K. Sato et al., "High Output Power and Narrow Linewidth Silicon Photonic Hybrid Ring-Filter External Cavity Wavelength Tunable Lasers," ECOC, PD2.3 (2014), incorporated herein by reference. This combination allows long external silicon cavity design to reduce the laser spectral linewidth, while still achieving high output power.

In this work, we have demonstrated a hybrid-integrated silicon photonic tunable laser for coherent applications. The fiber-coupled output power reaches 140 mW (21.5 dBm) across the C-band. This is, to the best of our knowledge, the highest output power reported for silicon photonic tunable laser. Such high output power is desirable to compensate for the large coherent transceiver loss using complex modulation formats. Also, the long external cavity design reduces the laser linewidth down to a few tens of kHz level, which makes it suitable for 16 or 64 QAM modulations. Furthermore, our developed integrated sensor technology for the silicon photonic chip and associated control loop enable gridless and precise frequency tuning without using a wavelength locker.

The designs herein for the external cavity laser (ECL) are capable of accurate frequency tuning and control due to well-developed resistance temperature detector (RTD) sensor technology and associated control loop. Certain issues and solutions regarding thermal applications and controls for multiple filters on a common integrated-optics substrate are described in Applicant's earlier work described in U.S. Pat. No. 7,447,393 to Yan et al., entitled "Thermal Control of Optical Components," incorporated herein by reference. Although the situations addressed therein are substantially different than for silicon-photonics components, our technical findings described herein establish that analogous thermal control approaches can be combined with innovative silicon-photonics configurations to provide substantial improvements in the optical-frequency control of a compact ECL tunable laser.

The reason of using RTD is to lock the filter temperature accurately against any external thermal disturbance such as package temperature change or gain current change. However, one challenge is that the RTD sensor on a silicon photonics (SiPho) chip cannot be fabricated in direct contact with the silicon waveguide filter due to the resulting significant optical loss. As a result, the RTD generally is fabricated at certain distance away from the waveguide filter (generally around 1-2 microns), which gives a thermal gradient, and the RTD cannot measure accurately the temperature change of the filter. This configuration is in contrast to Applicant's current commercial ECL with a free space etalon tuning structure, where the RTD is in direct contact with the filter based on the etalon and can measure the filter temperature change much more accurately. FIG. 1 is the calculated extra frequency error of a SiPho based ECL using RTD associated with each of two ring filters comparing to the current commercial free space etalon ECL. Even with a low thermal crosstalk of 1:100 on chip, there is still an extra 0.5 GHz frequency error of SiPho ECL due to the thermal gradient.

To mitigate the problem of indirect temperature measurements, silicon photonic chips are described with an extra integrated reference RTD on the SiPho chip and adjust the heater powers and/or thermoelectric cooler (TEC) accordingly to cancel out any thermal disturbance. The chip and generally the laser generally can be placed on a thermoelectric cooler, which are well known in the art to help control the overall device temperature. The three-RTD control approach of SiPho ECL provides high frequency accuracy similar to the current commercial ECL. Furthermore, as demonstrated in the following, the test data show that with only one single reference RTD, calibrating and tuning the two filter heater powers can provide accurate wavelength tuning, without the need of two other RTDs at the filters. In any case, though, the RTD associated with each ring resonator can provide for tuning of the frequency. In some embodiments, following completion of a device, the frequency is selected and the heaters along with the TEC are calibrated to enable setting and maintaining the desired frequency in the tunable range. The initial calibration can then provide the baseline for maintaining the selected frequency during use. Furthermore, embodiments of the SiPho chip are described in which trenches can be used to decrease the thermal cross talk so that the frequency error can be decreased correspondingly, such that the two RTD associated with each ring resonator can provide more accurate adjustment for thermal fluctuations.

In the following, we show the frequency stability and precise frequency tuning of the demonstrated silicon photonic laser. While gridless frequency tuning can be easily obtained by controlling two ring heaters, the accurate frequency control down to sub-1 GHz level against drift and mode-hop over the device lifetime is very challenging for silicon photonic lasers. This is in large degree due to the high sensitivity of silicon material to thermal disturbances, for example, from package temperature changes or gain chip/SOA current changes. To address this issue, we have leveraged our well-developed sensor technology for fabricated silicon photonic chips.

High-Performance Hybrid-Integrated Silicon Photonic Tunable Laser

Figure 2:
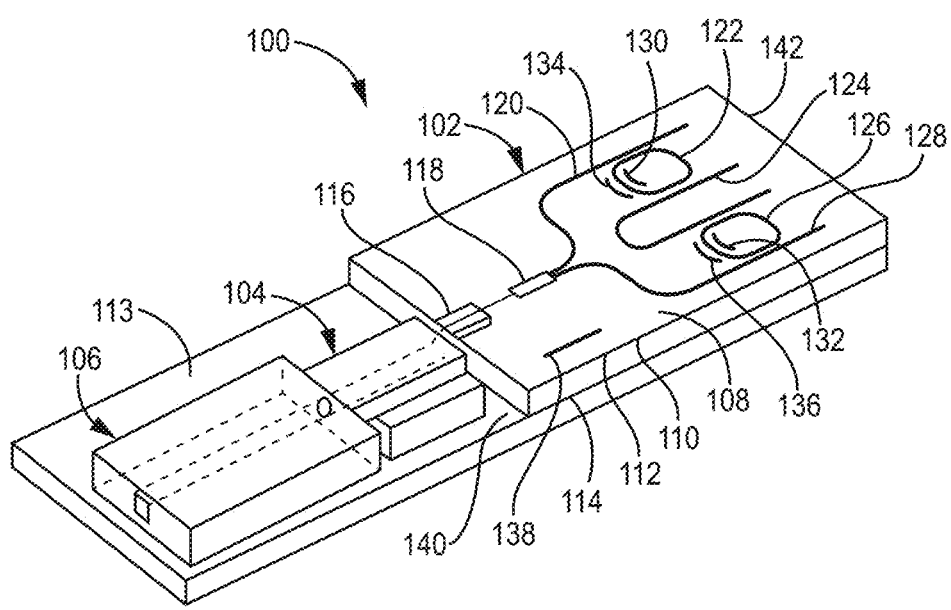
FIG. 2 is a schematic perspective view of an embodiment of tunable solid-state laser that includes silicon photonic filter chip and semiconductor-based gain chip, which may be coupled to semiconductor optical amplifier (SOA).

As described herein, and referring to FIG. 2, silicon photonic tunable laser 100 consists of a gain chip 104 and a ring-resonator-based silicon photonic filter chip 102. A booster semiconductor optical amplifier (SOA) 106 can be integrated through lens coupling for light amplification before the output fiber. FIG. 2 shows the schematic layout of the laser device 100 in association with SOA 106.

In an embodiment, optical device 100 comprises silicon photonic filter chip 102 and gain chip 104. Spot-size converter 116, such as a lens, connects the optical path of filter chip 102 and gain chip 104.

In some embodiments, silicon photonic filter chip 102 and gain chip 104 rest on a thermoelectric cooler (TEC) 113 to help control the overall device temperature, and the TEC may also be controlled with a controller described below. TEC components are known in the art. For convenience, the overall laser device 100 with filter chip 102, gain chip 104 and TEC (if present) can be referred to as a tunable external cavity laser device, which generally would be assembled together in a package.

In an embodiment, silicon photonic filter chip 102 is a multi-layer device comprising upper cladding layer 108, silicon device layer 110, lower cladding layer 112, and silicon substrate 114. Upper cladding layer 108 forms a top layer of filter chip 102; silicon device layer 110 is located between upper cladding layer 108 and lower cladding layer 112; lower cladding layer 112 is located on silicon substrate 114, which forms a bottom portion of filter chip 102. In an embodiment, upper cladding layer 108 and lower cladding layer 112 comprise silicon dioxide, although other low index of refraction optical material can be used. Further, it will be understood that "device layer" refers to a layer comprising "devices" such as waveguides and resonators that may be located between the upper and lower cladding layers 108 and 112, and which may be surrounded by one or both of cladding layers 108.

Figure 3:
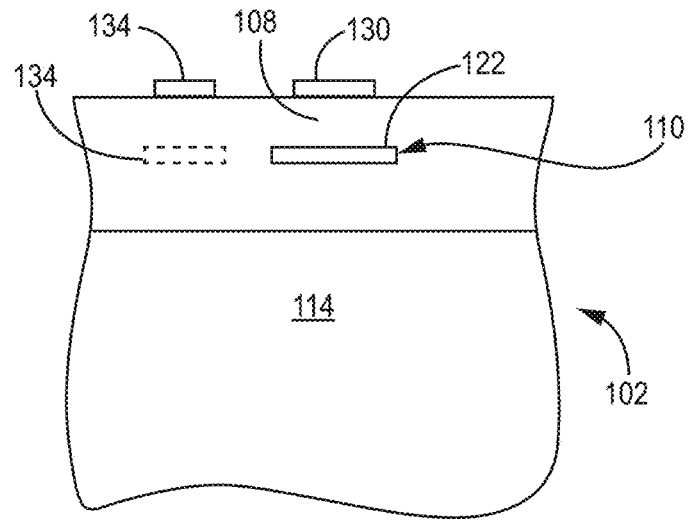
FIG. 3 is a side, sectional view of a portion of an embodiment of a silicon photonic filter chip.

The silicon photonic (SiPh) chip generally comprises silicon device layer 110 sandwiched between upper cladding layer 108, e.g., silicon dioxide, and lower cladding layer 112, e.g., silicon dioxide, and bottom silicon substrate 114. The ring resonator filter is fabricated at the silicon device layer 110. The integrated heaters can be formed on top of the silicon ring resonator, separated by the upper silicon dioxide cladding layer 108. The reason for this arrangement is that the heater cannot be directly formed onto the silicon ring resonator due to the resultant large optical propagation loss. The configuration is shown in FIG. 3.

A silicon photonics chip generally comprises a silicon waveguide of elemental silicon, potentially with a dopant, that is embedded generally in silicon dioxide ($SiO_2$, which can be referred to as silicon oxide, although silicon oxide can also silicon suboxides with different oxidation states) or other appropriate cladding. The cladding confines the light in the silicon waveguide due to the index or refraction difference. The waveguides and other structures for the silicon photonics chip can be formed using photolithography or other appropriate patterning technique. With a silicon oxide cladding, the processing can adapt processes from silicon on insulator processing from microelectronics. Due to the high index of refraction of silicon, the silicon waveguide can have a thickness of about 0.2 microns to about 0.5 microns. The cladding thickness above and below the silicon waveguide generally can range from about 0.3 microns to about 3 microns. Various ring resonator structures, which are curved silicon wave guides can be used as a filter to provide for selection of a frequency for the laser. Each ring resonator provides for stable reflection of various harmonics, and thermal control can be used to control thermal fluctuations of the ring resonator frequencies. Using a plurality of ring resonators with slightly different spectral ranges allows for selection of selecting the harmonic which provides the common frequency for the plurality of rings. The laser then lases at the common frequency. This selection process is described further in Sato et al. The resonator rings are placed adjacent to waveguides such that resonance frequencies are coupled between the waveguide by the ring. The waveguides are placed sufficiently close to the waveguides such that there can be good optical coupling without an undesirable degree of loss. Each ring is associated with a heater to provide both for frequency tuning and for maintenance of a constant ring resonator temperature. Each ring resonator can also be associated with a temperature sensor, which may be an RTD, to measure temperature associated with that ring within a particular temperature sensitivity, as explained below. In some embodiments, the silicon optical chip is designed with a RTD that is spaced away from heaters associated with the ring resonators so that the RTD can measure changes in chip temperature. The temperature measurement from the chip level RTD sensor is used in the feedback loop.

Silicon photonic filter chip 102, in an embodiment, comprises spot-size converter 116, splitter-combiner 118, first waveguide portion 120, first ring resonator 122, coupling waveguide portion 124, second ring resonator 126, second waveguide portion 128, first heater 130, second heater 132, first ring-temperature sensor 134, second ring-temperature sensor 136, and filter chip temperature sensor 138.

Spot-size converter 116 couples silicon photonic filter chip 102 to semiconductor-based gain chip 114 and provides mode size matching to loss due to the interface between filter chip 102 and gain chip 104. In additional or alternative embodiments, a separate spot size converter can be placed between gain chip 104 and silicon photonic filter chip 102. In general, the gain chip can be a gain chip used in ECL having free space filters. Suitable gain chips are described in U.S. Pat. No. 6,882,979B2 to Daiber, entitled "External Cavity Laser With Continuous Tuning of Grid Generator," and U.S. Pat. No. 8,462,823B2 to Daiber et al., entitled "Small Package Tunable Laser With Beam Splitter," both of which are incorporated herein by reference.

Splitter-combiner 118 is coupled to spot-size converter 116 and first and second waveguide arms 120 and 128. Together splitter/combiner 118, first waveguide arm 120 and second waveguide arm 128 form portions of a multi-filtered Sagnac interferometer. Splitter-combiner 118 is configured to split an incoming light signal and direct a first portion to first waveguide 120 and a second portion to waveguide 128. Splitter-combiner 128 is also configured to combine light received from first and second waveguides 120 and 128 and direct it back to spot-size converter 116.

First ring resonator 122, second ring resonator 126, first waveguide arm 120, coupling waveguide portion 124 and second waveguide arm 128 are fabricated at silicon device layer 110. Upper cladding layer 108 is formed on top and around the ring resonators and waveguides, while lower cladding layer 112 is formed below and possibly around the ring resonators and waveguides. Each of first ring resonator 122 and second ring resonator 126 comprise ring-shaped or circular waveguides configured to cause coupled-in light to couple into the ring and then transmit along the ring. The dimensions and index of refraction determine the resonance frequency and harmonics associated with the ring resonator. Heating the ring resonator changes the index of refraction and correspondingly the resonance frequency.

Each of first waveguide arm 120 and second waveguide arm 128 may be shaped having a linear section joined by a curved section, as depicted. In other embodiments, first and second waveguide portions 120 and 128 may define other shapes that include linear and curved portions. In an embodiment, first waveguide portion 120 is symmetrical to second waveguide portion 128 about a longitudinal axis of photonic chip 102 that extends from first end (front end) 140 of photonic chip 102 adjacent gain chip 104 toward second end (rear end) 142 of photonic chip 102, opposite gain chip 104. Due to the looping nature of the Sagnac interferometer, whether or not first waveguide portion 120 and second waveguide portion 128 are symmetric is generally not significant. In an embodiment, and as depicted, each of first and second waveguide portions 120 and 126 terminate adjacent second end 142, such that any non-resonant light generally dissipates.

Coupling waveguide portion 124, in an embodiment substantially forms a "U" shape with a curved middle section adjoin a pair of linear portions, and is located between first ring resonator 122 and second ring resonator 126. Coupling waveguide portion 124 is positioned sufficiently close to first ring resonator and second ring resonator that the elements are optically coupled. Although depicted as a "U" shape with a curved middle section, it will be understood that coupling waveguide portion 124 may define other shapes. In an embodiment, each end of coupling waveguide portion 124 extends axially beyond first and second ring resonators 122 and 126 and terminate adjacent second end 142.

In an embodiment, first ring resonator 122 is formed between a linear portion of first waveguide portion 120 and a linear portion of coupling waveguide 124 such that light can travel between first ring resonator 122, waveguide 120 and coupling waveguide 124. In an embodiment, first ring resonator 122 is formed such that a shortest path between first ring resonator 122 and adjacent first waveguide portion 120 occurs at a point that bisects the rearmost linear portion of first waveguide portion 120. Similarly, second ring resonator 126 is located between coupling waveguide 124 and second waveguide 128 such that light can travel between waveguide 124, second ring resonator 126 and second waveguide portion 128. Consequently, a light path or channel between first waveguide portion 120 and 128 is formed for light to travel in a generally lateral or radial direction via first ring resonator 122, coupling waveguide 124 and second ring resonator 128 to effectively reflect light that it resonant with both ring resonators back toward gain chip 104, except along the opposite arm.

First heater 130, in an embodiment, is an integrated heater of photonic chip 102. First heater 130 is located proximate to first ring resonator 122 such that heat may be transmitted to first ring resonator 124 and a resonant frequency of resonator 122 may be "tuned" as described further below. In an embodiment, first heater 130 generally is located above, and in some cases, directly above, first ring resonator and may be separated from first ring resonator 122 by upper cladding layer 108. In other embodiments, above and slightly shifted in the plane relative to first ring resonator 122 such that it is not quite directly above, with a portion of upper cladding layers 108 separating first heater 130 from first ring resonator 122. Similarly, second heater 132, in an embodiment, is an integrated heater of photonic chip 102. Second heater 132 is located proximate to second ring resonator 126 such that heat may be transmitted to second ring resonator 126. In an embodiment, second heater 132 generally is located above, and in some cases, directly above, second ring resonator 126 and may be separated from second ring resonator 126 by upper cladding layer 108. In other embodiments, second heater 132 may be above and slightly shifted to be not directly above second ring resonator 126 in device layer 110, with a portion of upper cladding layers 108 separating second heater 132 from second ring resonator 126.

The gain chip and the SOA are generally based on similar semiconductor technologies. The gain chip and SOA differ in specific function and, therefore, can be designed with different optimizations in mind. Specifically, the gain chip provides a portion of the laser cavity so that its front surface is partially reflective to set up the standing wave to drive coherent stimulated emission for lasing. The SOA is not part of the laser cavity and can be designed accordingly to just provide power gain to optical transmissions through the SOA. The compositions of the gain chip and the SOA are generally distinct and the coupling of the waveguides can account for the distinct waveguide dimensions, such as with a spot-size converter.

Referring to FIG. 3, a portion of a photonic chip 102 having a first heater 130 positioned directly above first ring resonator 122 is depicted in cross section. Cladding layer 108 separates heater 130 from ring resonator 122. Alternatively, heater 134 may be located in device layer 110 proximate to ring resonator 122. In one such embodiment, ring resonator 122 and heater 130 may be separated by cladding layers 108 and/or 112.

In an embodiment, heaters 130 and 132 may be curved, and in one such embodiment, each heater may generally define a curvature that is substantially the same as a curvature of ring resonators 122 and 126, respectively. Having a same or similar curvature creates a uniform distance from portions of the heater to adjacent portions of the ring resonator. Further, in an embodiment, first heater 130 and second heater 132 may comprise materials, such as metals or silicon materials, such as platinum, titanium nitride or polysilicon.

When electric current flow through the integrated heaters, the temperature of heaters and surrounding materials increases, and the refractive index of the ring resonator filter changes from the thermo-optical effect. This change of refractive index shifts the resonant frequency of silicon ring resonators and thereby allows control of the laser frequency. Although the laser frequency can be effectively tuned through this heater current control, the heater material may age because of the high current and high temperature at the heaters. This may change the heater resistance during the device lifetime and result in error in the laser frequency. A close-loop control of the heater current is thus desirable to accurately fix the temperature and thereby the resonant frequencies of the silicon ring resonators. Closed-loop control is also desirable to adjust for ambient temperature changes that can alter the temperature of the ring resonators due t heating from the heaters.

Referring again to FIG. 3, in an embodiment, first ring-temperature sensor 134 and second ring-temperature sensor 136 may each comprise a resistance temperature sensor, such as a resistance temperature detector (RTD). First ring-temperature sensor 134 and second ring-temperature sensor 136 may comprise materials such as platinum, nickel, copper, doped silicon or other such materials.

Ring-temperature sensors 134 and 136 are generally located in close proximity to their respective ring resonators 122 and 126 so as to detect a temperature of their respective resonators. In some embodiments, first and second ring-temperature sensors 134 and 136 are fabricated directly onto their respective ring resonators 122 and 126 so as to more accurately measure a temperature of the ring resonator and its waveguide. However, in such an embodiment wherein temperature sensors 134 and 136 are fabricated directly on ring resonators 122 and 126, respectively, optical propagation loss may be increased due to the overlap between the temperature sensor material and the optical mode in the ring resonators.

Consequently, in some embodiments, ring-temperature sensors 134 and 136, as shown in FIG. 2, may be deposited proximate to their respective ring resonators 122 and 126, but may be separated by silicon dioxide material, such as upper cladding layer 108. In one embodiment, first and second ring-temperature sensors 134 and 136 are at upper cladding layer 108 and above (directly above or displaced laterally or displaced above and laterally) their respective first and second ring resonators 122 and 126. FIG. 3 depicts in an embodiment first ring-temperature sensor 134 formed atop upper cladding layer 108, displaced laterally and above, and separated from first ring resonator 122 by a portion of cladding layer 108. In one such embodiment, upper cladding layer 108 between a ring resonator 122 or 126 and its respective ring-temperature sensor 128 or 130 is roughly 2 µm thick. In an alternative embodiment depicted in FIG. 3, ring-temperature sensor 134 is displaced laterally in the silicon device layer, which can be particularly appropriate if RTS 134 is formed from doped silicon.

As illustrated in FIG. 2, on-chip integrated resistance temperature detectors (RTD) or temperature sensors, using materials such as platinum, nickel, copper, or doped silicon, can be fabricated in close proximity to the silicon ring resonators. Their resistance readings changes with the temperature and may be used as the signal feedback in closed-loop control to keep the ring resonator at a constant temperature over the device lifetime. Ideally, the RTD should be fabricated directly onto the silicon ring resonators to accurately measure the temperature of the silicon waveguide. However, such a configuration with direct contact would significantly increase the optical propagation loss due to the overlap between the RTD material and the optical mode in the silicon ring waveguides. As a result, RTD may either employ thin metal films deposited on top of the silicon ring resonators, separated by the upper silicon dioxide cladding layer, or use doped silicon on the same silicon device layer next to the silicon ring resonators.

Filter chip temperature sensor 138, which may also comprise an RTD, is formed at a portion of silicon photonic filter chip 102 that is sufficiently distant from ring heaters 128 and 130, thereby being configured to sense an overall or global chip 112 temperature and to provide a chip reference temperature. In an embodiment, filter chip temperature sensor 136 is formed adjacent a corner of silicon photonic filter chip 102 at an end of chip 112 that includes SSC 138.

The semiconductor optical amplifiers, used as such or in a gain chip of an ECL, generally comprises a p-n (or p-i-n) junctions with appropriate semiconductor materials. Additional layers are generally present, which may be intrinsic layers (low dopant layers) and may provide cladding for the optical waveguides. While generally various semiconductor materials can be used, for optical applications III-V semiconductors can provide desirable performance. Thus, suitable semiconductors include, for example, indium phosphide, gallium arsenide and variations thereof. The gain chip used in a specific embodiment described below is based on InGaAsP. An indium phosphide based optical amplifier is described further in published U.S. patent application 2005/0052726 to Nakagawa et al., entitled "Optical Module and Optical Communication system," incorporated herein by reference. A semiconductor laser based on various III-V semiconductors is described in published U.S. patent application 2019/0097385 to Blauvelt, entitled "Wavelength Stabilized Semiconductor Laser Source," incorporated herein by reference. A ridge laser having five quantum well laser with InGaAsP layers deposited epitaxially on an InP substrate is described in published U.S. patent application 2014/0140363 to Pezeshki et al., entitled "Semiconductor Distributed Feedback (DB) Laser Array with Integrated Attenuation," incorporated herein by reference.

Figure 4:
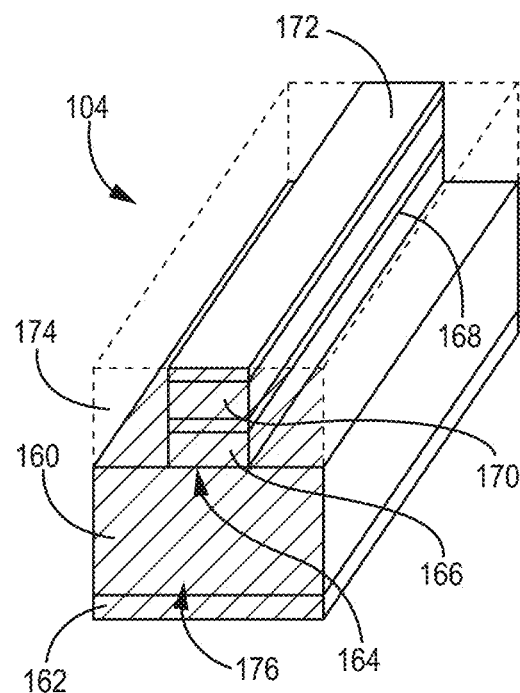
FIG. 4 is a perspective view of an embodiment of a semiconductor-based gain chip, which may be coupled to a silicon photonic filter chip.

The basic designs of a semiconductor-based amplifier for use as a gain chip or SOA (semiconductor optical amplifier chip) are found in FIG. 4. Referring to FIG. 4, an embodiment of a semiconductor-based amplifier chip 104 is depicted. As depicted, semiconductor-based amplifier chip 104 comprises substrate 160, base electrode 162, laser element 164. Laser element 164 comprises n-doped layer 166, active region 168, p-doped layer 170 and drive electrode 172. An optional dielectric layer 174 can be placed over the surface of substrate 160 at locations not covered by laser element 164. Dielectric layer 174 is shown in phantom lines in FIG. 3, and the height of dielectric layer 174 may be commensurate with the top of laser element 164 to provide a desired degree of surface isolation. Substrate 160 can comprise a doped semiconductor with sufficient doping to provide a desired degree and polarization of electrical conductivity. The end of gain chip 104 can comprise a reflective coating 176 at least covering the light emitting layers, although as shown in FIG. 4 covering the entire face of the device that is gain chip 104. The opposite end of semiconductor-based amplifier chip in FIG. 4 is the light-emitting end of laser element 164.

One facet of the gain chip can be cleaved as the laser output port. The other facet can be anti-reflection coated and is butt-coupled to the silicon photonic chip. Here, care can be taken to design spot-size converters on both the gain chip and the silicon photonic chip for mode size matching. The measured butt-coupling loss between the two chips can b on the order of 1 dB. Such a low coupling loss is desirable for silicon photonic devices. The laser output from the gain chip goes through a booster SOA for amplification, and generally is then coupled into a single-mode fiber, respectively through two coupling lenses. The spot-size-converter, such as lenses, can be designed to adjust the beam dimensions from one waveguide to another waveguide, which can be the optical fiber. Appropriate lens alignment is known in the art. See, for example, published U.S. patent application 2005/0069261 to Arayama, entitled "Optical Semiconductor Device and Method of Manufacturing Same," incorporated herein by reference. A multistage spot-size-converter is described in published U.S. patent application 2019/0170944 to Sodagar et al., entitled "Multistage Spot Size Converter in Silicon Photonics," incorporated herein by reference.

As described herein, the use of a booster SOA has a few advantages. First, SOA amplification gives high output power while allowing lower optical power density in the silicon photonic waveguide. This prevents lasing instability from silicon non-linear effects, as described in T. Kita et al., "Narrow Spectral Linewidth Silicon Photonic Wavelength Tunable Laser Diode for Digital Coherent Communication System," IEEE JSTQE 22, 1500612 (2016), incorporated herein by reference. Second, the reduced optical power in silicon chip gives lower absolute loss from waveguide coupling and propagation, therefore improving the device power efficiency. Third, since SOA is outside of the laser cavity, it separates the laser power control from the wavelength tuning and thus simplifies the laser control loop.

The transmission spectrum of each ring resonator filter can be tuned through the integrated waveguide heater. By controlling the integrated heater powers on both ring resonator filters, the lasing mode can be selected over a large spectral range at the overlapping frequency of two transmission peaks of the two ring resonators. The light passing through two cascaded ring filters is then looped back into the gain medium chip to provide the laser optical feedback.

Figure 5:
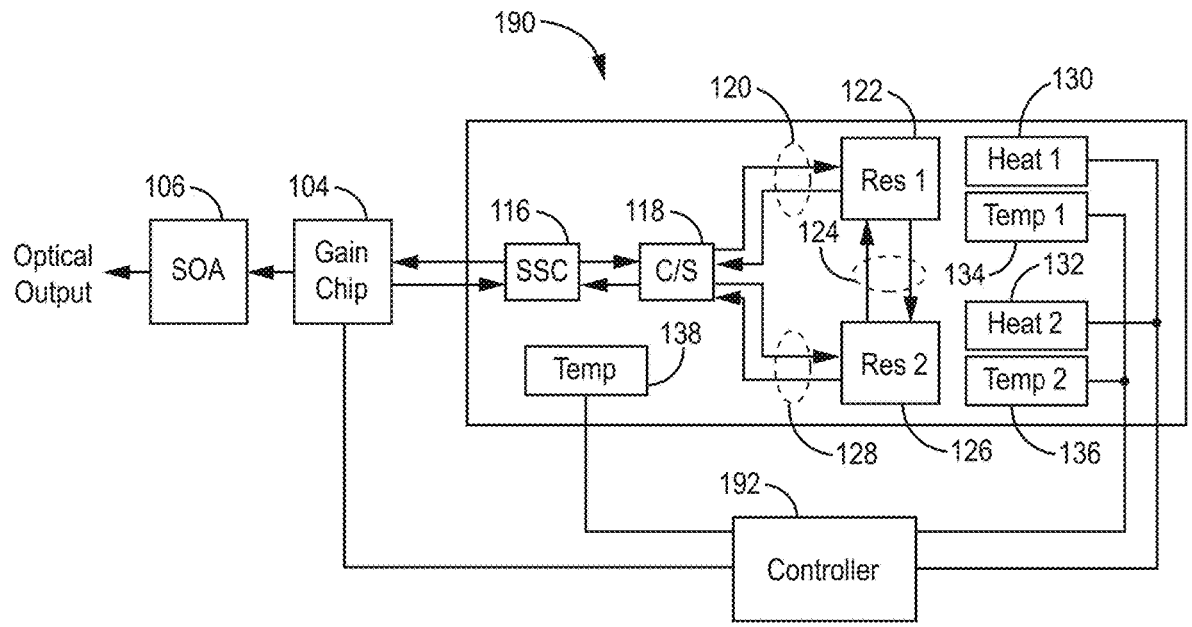
FIG. 5 is a block diagram of an embodiment of a tunable laser system.

Referring to FIG. 5, a schematic diagram of an overall tunable laser system 190 is depicted to provide further insights on the overall operation of the device. Tunable laser system 190, as depicted, comprises silicon photonic filter chip 102, gain chip 104, SOA 106 and controller 192. As described above, silicon photonic filter chip 102 comprises SSC (spot-size converter) 118 coupled to combiner-splitter 118, which is coupled to first and second ring resonators 122 and 126 via first and second waveguide portions 120 and 128, respectively. While SSC 118 is described as a component of silicon photonic filter chip 102, it should be understood that this description also included a component that is mounted between silicon photonic filter chip 102 and gain chip 104. First and second ring resonators 122 and 126 are coupled via coupling waveguide 124. Consequently, SSC 118, combiner-splitter 118, first ring resonator 122 and second ring resonator 126 are in optical communication with one another.

Controller 192 may comprise a microcontroller, microprocessor, digital processor, or similar, or combinations thereof, as well as memory of appropriate kinds known in the art, and other control electronics. As also described above with respect to FIG. 2, filter chip 102 comprises first and second heaters 130 and 132 and associated first and second resistance temperature sensors 134 and 136. Controller 192 generally is in appropriate electrical communication with heaters 130 and 132. Thus, controller 192 can be configured to control the amount of heat produced by the heaters, and hence how much heat is transferred to first and second ring resonators 122 and 126.

Controller 192 generally is also in electrical communication with first ring-temperature sensor 134, second ring-temperature sensor 136 and filter chip temperature sensor 138. Controller 192 is configured to receive input from first ring-temperature sensor 134, second ring-temperature sensor 136 and filter chip temperature sensor 138, and to control heaters 130 and 132 based on the received input. In an embodiment, controller 192 is also in electrical communication with gain chip 104 and is configured to control one or more operations of gain chip 104. In some embodiments, controller 192 can perform a simple iterative temperature adjustment with small increments to the heaters to adjust the temperatures in appropriate directions. However, more elaborate feedback loops can be used, such as a proportional-integral-derivative approaches as discussed further below.

Figure 6:
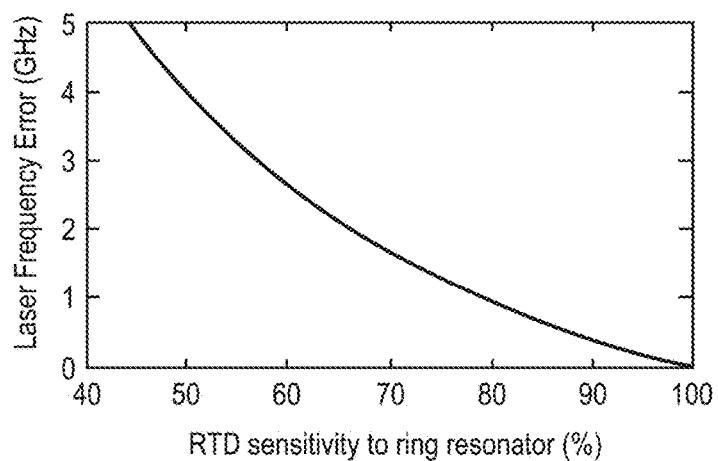
FIG. 6 is a plot of ring-temperature sensor (RTD) to a ring resonator vs. laser frequency error.

As illustrated by the simulation results in FIG. 6, when the RTD is separated from the silicon ring resonator by the upper silicon dioxide cladding of 2 micron thickness, its temperature rises by 17° C. while the ring resonator waveguide rises by 31° C. as the integrated heater is heated up. This corresponds to a 55% temperature sensitivity. In other words, the RTD temperature changes 55% of that of the silicon ring resonator. An RTD based on doped silicon in the silicon device layer also would have a temperature sensitivity with less than 1005 correlation due to temperature gradients. Any less than 100% temperature sensitivity produces inaccuracy in measuring the temperature of the ring resonator waveguide. This is because the RTD cannot differentiate between the local temperature change from the ring resonator and the global temperature change from the SiPho chip. The former is characterized by a RTD-silicon temperature gradient and a less than 100% temperature sensitivity depending on the distance between the RTD and ring resonators. The latter is characterized by a 100% temperature sensitivity because the RTD is buried in the SiPho chip and has exactly the same temperature change as that of the SiPho chip at thermal equilibrium.

A global chip temperature change may be caused by ambient temperature changes, the gain medium temperature changes, or thermal cross-talks from other on-chip integrated heaters. The RTD resistance signal is thus an overall effect from both the local and global heat sources characterized by different temperature sensitivities. It may give errors in temperature reading of the silicon ring resonator without knowing the respective contribution ratio of the two heat sources. This temperature reading error can be calculated as follows:

$$T_{error} = \frac{T_{RTD\_total}}{S_{RTD\_local}} - \left( \frac{T_{RTD\_local}}{S_{RTD\_local}} + \frac{T_{RTD\_global}}{S_{RTD\_global}} \right),$$

where $T_{RTD\_total} = T_{RTD\_local} + T_{RTD\_global}$ is the total RTD temperature change due to the two heat sources, and $S_{RTD\_local}$ and $S_{RTD\_global}$ are the RTD temperature sensitivity to the two heat sources, respectively. FIG. 3 shows the calculated ring resonance frequency error, assuming a global SiPho chip temperature change of ±0.4 C from an ambient temperature change of ±40 C, and a 10 GHz/C frequency to temperature sensitivity of ring resonator frequency. For a $S_{RTD\_local}$ of 50%, there will be 4 GHz lasing frequency error, which is higher than the frequency error specification of 1 GHz. Even for a $S_{RTD\_local}$ of 80%, there is already a 1 GHz frequency error consuming all the frequency error margin.

Figure 7:
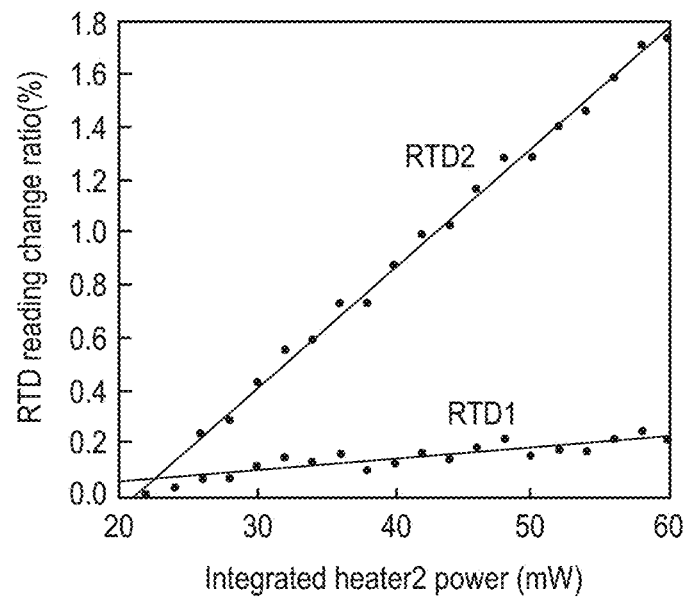
FIG. 7 is a plot of chip heater power vs. ring-temperature sensor (RTD) reading change ratio.

Besides the frequency error cause by limited RTD temperature sensitivity, a separate significant challenge for external cavity lasers using photonic integrated circuit is the significant thermal cross-talk between ring resonator filters as they are fabricated on the same silicon substrate. When one of the integrated heaters is tuned to control the properties of one frequency selective element, the thermal cross-talk from the integrated heater affects the second frequency selective element. In order to keep the second frequency element at a constant temperature, the second integrated heater can be tuned in a PID (proportional-integral-derivative) close loop control, which in turn also affects the first frequency selective element due to the thermal cross-talk from the second integrated heater. Such tuning of multiple integrated heaters in an iterative fashion due to the thermal cross-talk may thereby affect the tuning stability, tuning accuracy, and tuning time of frequency selective elements. As illustrated in FIG. 7, when integrated heater 2 is heated up by 60 mW heater power, the RTD2 resistance reading goes up by 1.8%, while the RTD1 reading also changes by around 0.2%, showing the thermal crosstalk from the integrated heater 2.

One approach to fix the frequency error and the thermal crosstalk is by adding a reference RTD to measure the global chip temperature change, as illustrated by the chip RTD in FIG. 2. As a result, RTD1 and RTD2 at the two frequency selective element locations can differentiate between the contributions of local ring resonator and global chip temperature changes. As described with respect to the specific prototype embodiment below, without this reference chip RTD, the lasing frequency drifts by as large as 4 GHz with the ambient temperature variations between 10° C. and 80° C. In contrast, with the reference chip RTD function enabled, the frequency drifts can be reduced by about one order of magnitude. The measured frequency errors can be within ±0.5 GHz, which in some embodiments is smaller than the frequency error specification of ±1 GHz. When the power from the SOA is increased, this results in a significant increase in the temperature in the SiPho chip. This temperature increase is explored below for the prototype embodiment with SOA current from 500 mA to 600 mA and then to 700 mA. With the chip level RTD sensor enabled, the control loop is able to maintain the laser frequency within specifications.

Figure 8:
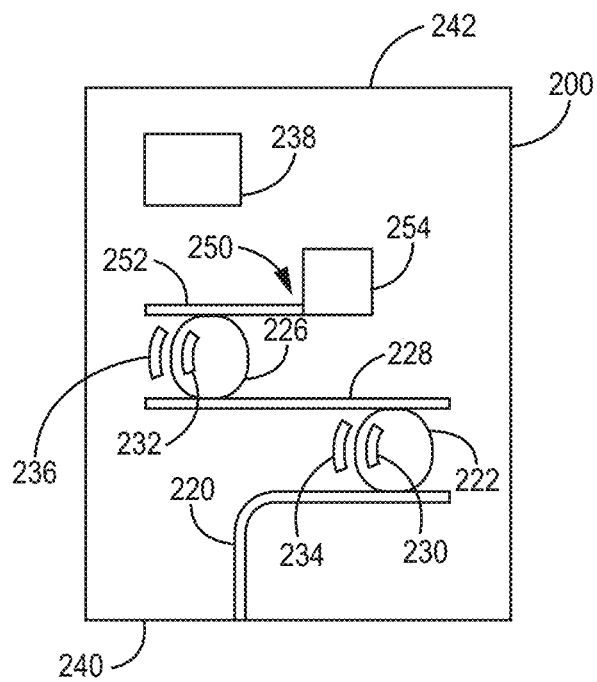
FIG. 8 is a top view of another embodiment of a silicon photonic filter chip, the chip having a pair of ring resonators and a waveguide terminating in a reflector.

As noted above, each ring resonator can also be adapted with a separate RTD sensor. Furthermore, as described herein, a chip level RTD sensor can provide improved feedback control of the ring resonator temperatures. A SiPho chip embodiment with ring resonators configured similarly to the structure in Sato et al. is shown in FIG. 8 with modifications to implement improvements described herein. Referring to FIG. 8, filter chip 200 is configured to couple to gain chip 104 in a manner similar to that described above with respect to filter chip 102. Also similar to filter chip 102, filter chip 200 includes a plurality of layers (see FIG. 2), including an upper cladding layer 108, a device layer 110, a lower cladding layer 112 and a substrate 114. However, rather than forming a loop-like waveguide optical path, the waveguides and resonators, along with a reflector, form a non-looped path, or a terminated path, wherein incoming light follows a generally same path as outgoing light, as explained further below. Filter chip 200 has the disadvantage relative to the structure in FIG. 2 of not providing an interferometer to provide improved stability and less sensitivity to optical noise in the laser cavity.

In the embodiment depicted in FIG. 8, within the structure provided by the plurality of layers, filter chip 200 comprises first waveguide portion 220, first ring resonator 222, second waveguide portion 228, second ring resonator 226, reflector portion 250, first heater 230, second heater 232, first ring-temperature sensor 234, second ring-temperature 236 and chip temperature sensor 238. Filter chip 200 defines first end (front end) 240 and second end (rear end) 242. First waveguide portion 220, first ring resonator 222, second waveguide portion 228, second ring resonator 226, and reflector portion 250 form an optical path for transmitting light, the optical path terminating at reflector portion 250. Light in resonance with the ring resonators reflects back through the optical path while other light generally dissipates.

In an embodiment, first waveguide portion 220 forms an arced shape with a first generally linear portion that is adjacent front end 240 of filter chip 200 and configured for optical communication with gain chip 104, a second generally linear portion that is adjacent first ring resonator 222, and a curved portion joining the first and second linear portions. Second waveguide portion 228, in an embodiment may be a generally straight, linear waveguide extending laterally between first ring resonator 222 and second ring resonator 226. Reflector portion 250 comprises a reflector in communication with second ring resonator 226. In an embodiment, reflector portion 250 may include waveguide portion 252 and reflector structure 254. In other embodiments, reflector portion 250 may only include waveguide 252 acting as a reflector, or only reflector structure 254. In an embodiment, reflector 254 may comprise a metallized mirror, a loop reflector, or another known type of optical reflector.

First and second heaters 230 and 232 are similar to heaters 130 and 132 as described in the first embodiment of filter chip 102, and may be selectively controlled by a controller, such as controller 192, to heat their respective ring resonators 222 and 226, thereby changing light frequency, i.e., "tuning" laser 100. First and second ring-temperature sensors 234 and 236 are similar to sensors 134 and 136 as described in the first embodiment of filter chip 102, and sense temperatures of their respective first and second ring resonators 222 and 226. Chip temperature sensor 238 is similar to chip sensor 138 of filter chip 102, and is configured to sense an overall or global temperature of filter chip 200 at a portion of chip 102 that is distal to heaters 130 and 132.

In operation, and in general terms, light from gain chip 104 in resonance with both resonator rings is transmitted into filter chip 200 along first waveguide portion 220, through first ring resonator 222, through second waveguide 228, through second ring resonator 226, and to reflector 250. Reflector 250 reflects light back along the path of second ring resonator 226, second waveguide portion 228, first ring resonator 222 and first waveguide portion 220 for output to gain chip 104 (see also, FIG. 2).

Figure 9:
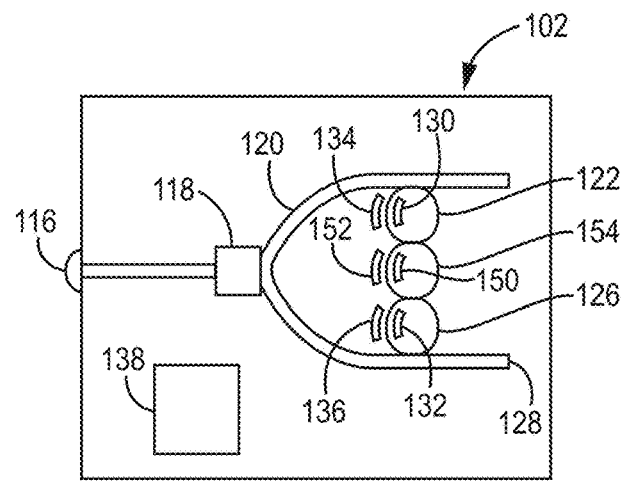
FIG. 9 is a top view of yet another embodiment of a silicon photonic filter chip, the chip having a plurality of ring resonators arranged side-by-side.

Referring to FIG. 9, another embodiment of a filter chip 270 is depicted having a non-interferometer based optical path terminating with a reflector. Filter chip 270 is similar to chip 200, but includes a series of ring resonators coupled to one another without intervening waveguides, as described in further detail below. This filter design is adapted from a transmitting optical filter structure in published U.S. patent application 2010/0183312 to Bolla et al., entitled "Method and Device for Hitless Tunable Optical Filtering," incorporated herein by reference.

In an embodiment, and as depicted in FIG. 9, filter chip 270 includes the plurality of chip layers as described above with respect to filter chip 102, i.e., layers 108-114 (see FIG. 2), as well as first waveguide 220, initial or first ring resonator 222, final ring resonator 226, reflector 252, initial or first ring heater 230, final ring heater 232, initial or first ring-temperature sensor 234, final ring-temperature sensor 236, and chip sensor 238. An axis extending between first end 240 and 242 defines a longitudinal axis.

First waveguide portion 220, as depicted in FIG. 9, comprises a straight, linear waveguide extending axially along chip 270, and is configured to communicate with gain chip 104 (see FIG. 2) at first end 240 of filter chip 270. Although first waveguide portion 220 is depicted as linear, it will be understood that first waveguide 220 may define other shapes, such as, but not limited to, the curved shape of waveguide 220 of filter chip 200, or the curved shape of waveguide 120 of filter chip 102.

Filter chip 270 may include a plurality of two or more ring resonators, including first ring resonator 222 and final ring resonator 226, forming a ring resonator series. Ellipses 221 indicates that additional ring resonators, not depicted, optionally may be located between first and final ring resonators 222 and 226. If there are no additional ring resonators, first ring resonator 222 and final ring resonator 226 would be positioned adjacent each other to provide appropriate optical coupling. In an embodiment, the ring resonators are distributed in a lateral or radial direction, the ring resonators adjacent to one another and in optical communication with one another. In an embodiment, the ring resonators are aligned linearly in a lateral direction, as depicted in FIG. 8, i.e., in a straight line. In other embodiments, some ring resonators may be offset from one another in an axial direction.

Final waveguide 252 extends axially and is formed adjacent final ring resonator 226. Final waveguide 252 defines two ends, one end near chip end 240 and another end near chip end 242. In an embodiment, and as depicted, final ring resonator 232 is formed and positioned nearer chip end 240 than chip end 242. Final waveguide 252 acts as a reflector, reflecting light received from final ring resonator 226 back into ring resonator 226. Final waveguide 252 may comprise other shapes, such as a partial loop or curved section, and may include additional reflective elements.

Heaters 230 and 240 in conjunction with ring-temperature sensors 234 and 236 may be utilized to control and tune solid state laser 100 as described above with respect to the embodiment of filter chip 102.

Figure 10:
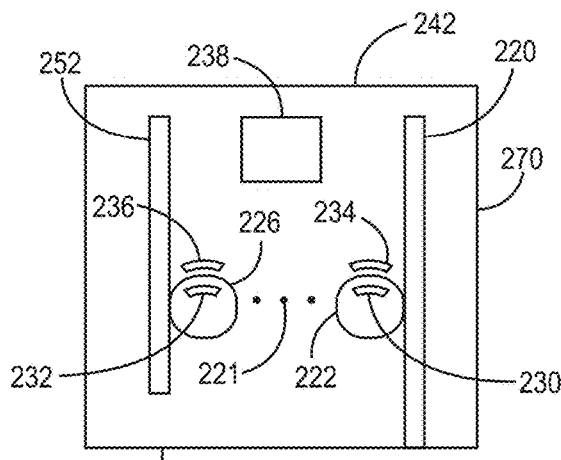
FIG. 10 is an embodiment of another embodiment of a silicon photonic filter chip, the chip having a bifurcated waveguide and a plurality of coupled ring resonators.

Referring to FIG. 10, another embodiment of silicon photonic filter chip 102 that includes the multi-filtered Sagnac interferometer feature of the embodiment of FIG. 2. In the embodiment depicted, this embodiment of filter chip 102 comprises spot-size converter 116, splitter-combiner 118, first waveguide portion 120, first ring resonator 122, second ring resonator 126, third ring resonator 154, second waveguide portion 128, first heater 130, second heater 132, third heater 150, first ring-temperature sensor 134, second ring-temperature sensor 136, third ring-temperature sensor 152 and filter chip temperature sensor 138. Similar to the embodiment of FIG. 2, filter chip 102 of FIG. 10 includes splitter-combiner 118 that splits an incoming light signal such that a first light portion travels along first waveguide 120 toward first ring resonator 122 and a second light portion travels along second waveguide 128 toward second ring resonator 126. However, in this embodiment, first and second ring resonators 122 and 126 are coupled by one or more ring resonators, such as by third ring resonator 154. In principle, the third ring resonator can impose a constraint on reflected light that the light be appropriately in resonance with all three ring resonators, which can result in greater side band suppression Based on this design, light traveling along an arm from the splitter-combiner can couple into a ring resonator, transition to third ring resonator 154, then into the opposite ring resonator to third ring resonator 154, and down the opposite arm toward the splitter-combiner, if the light is in resonance with all three ring resonators.

A second proposed method is by fabricating thermal isolation trenches into the silicon substrate in a way that the silicon ring resonator, integrated heater and temperature sensing RTD are all significantly thermally isolated from other components on the SiPho integrated circuit. This can significantly increase the RTD temperature sensitivity and thus lower the frequency error. FIG. 10 shows a schematic diagram of one of such trench structures. As all the components including the heater, RTD, and silicon ring are within the thermal isolated region, they will have almost the same temperature at their thermal equilibrium. In other words, the RTD temperature sensitivity to local ring resonator becomes close to 100%.

As illustrated in FIG. 6, when the RTD temperature sensitivity to local ring resonator increase up to 95%, the frequency error drops to ~0.2 GHz, well below our specification of 1 GHz frequency error margin. A second benefit by using this thermal isolation trench is the significantly decreased thermal cross-talk between the frequency selective elements, as the integrated heater is confined within the thermal isolation region with very limited generated heat leaking out of the region. The thermal isolation trench can have a few different structure designs, as described in FIGS. 11-15.

Figure 13:
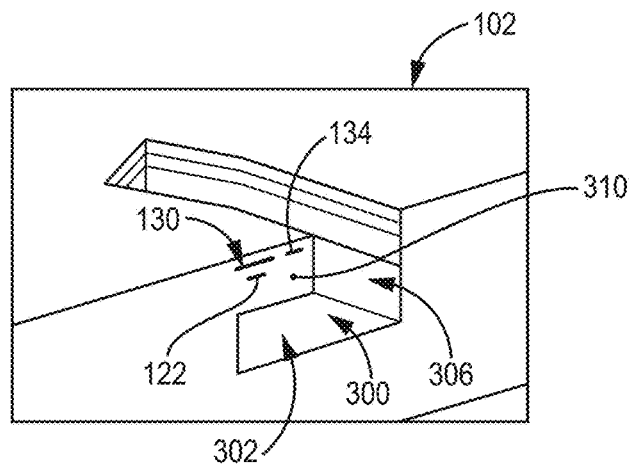
FIG. 13 is a top perspective view of another embodiment of a silicon photonic filter chip that includes an L-shaped thermal-isolating trench that partially surrounds the ring resonator.
Figure 14:
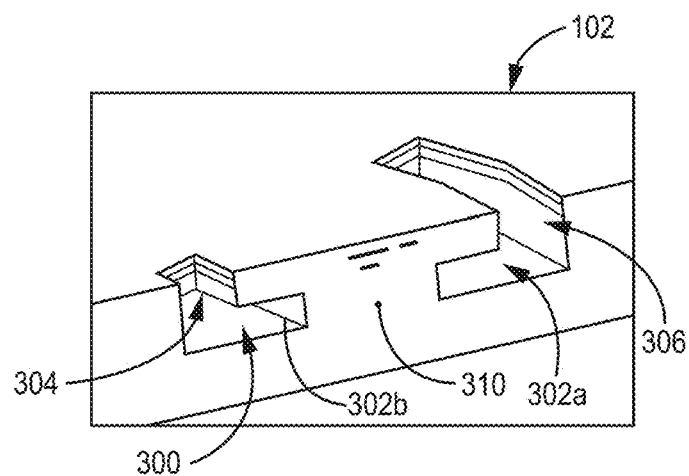
FIG. 14 is a top perspective view of yet another embodiment of a silicon filter chip that includes a pair of thermal-isolating trenches.
Figure 11:
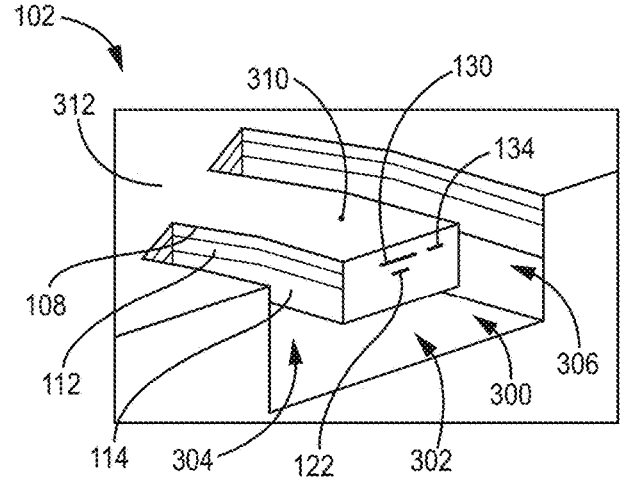
FIG. 11 is a top perspective view of an embodiment of a silicon photonic filter chip that includes a thermal-isolating trench around the ring resonator.

Referring to FIGS. 11-15, several embodiments of silicon photonic filter chip 102 that define thermal-isolating trenches in the chip are depicted. The features described in FIGS. 11-15 may be employed not only by filter chip 102, but also by the other various embodiments of filter chips described herein, including, but no limited to, filter chips 200 and 270. The use of thermal-isolating trenches around ring resonators, integrated heaters and temperature sensors contribute to thermal isolation of these components, thereby significantly increasing thermal sensitivity of the temperature sensors, such that the temperature sensed by the temperature sensors more closely corresponds to temperatures at the ring resonators, thereby lowering frequency-tuning error. While FIG. 11 depicts a thermal isolation trench 300 that surrounds thermally-isolated regions 300 on a bottom and two sides, other designs or shapes, as viewed in cross section, may be used, such as those depicted in FIGS. 13 and 14. Each of FIGS. 11, 13 and 14 depicts a portion of a silicon photonic filter chip 102 as viewed in perspective and in cross section. Only a portion of each ring resonator 122 is depicted for illustrative purposes.

Trench designs include, for example, the complete undercut of silicon under the ring waveguide at the heated region, as illustrated in FIG. 11. Referring specifically to FIG. 11 (cross-section of FIG. 12), and to FIG. 12 (top view of portion of silicon photonic filter chip 102), thermal-isolating trench 300 is depicted. In the top view, ring resonator 122 is shown in dashed lined to indicate that it is hidden structure in that it is not on the structure surface. In this embodiment, heater 130 is located directly above ring resonator 122 and may be formed in a cladding or other layer, as depicted. Ring-temperature sensor 134 is positioned laterally offset from heater 130 in the same layer as heater 130. In the embodiment depicted heater 130 defines a lateral width that is greater than a lateral width of ring resonator 122 so as to ensure sufficient and uniform heating of ring resonator 122.

Thermal-isolating trench 300 includes first or bottom portion 302, second or inside portion 304 and third or outside portion 306. Thermal-isolating trench 300 may generally form a "U" shape in cross section as depicted, and forms an arcuate shape. In an embodiment, trench 300 is formed by removing portions of substrate 114, lower cladding layer 112 and upper cladding layer 108, around ring resonator 122, leaving device-support portion 310.

Thermal-isolating trench 300 surrounds thermally-isolated region 310 on a first or bottom side, second or inner side and right or outer side. In an embodiment, thermally-isolated region 310 comprises a portion of layers 114, 112, and 108, with portions of ring resonator 122, heater 130 and ring-temperature sensor 134 embedded therein. Thermally-isolated region 310 extends from chip base portion 312, and defines an arcuate shape. In an embodiment, the curvature of thermally-isolated region 310 is substantially the same as the curvature of ring resonator 122, and forms a bridge-like structure between base portion 312 and another base portion opposite base portion 312.

Figure 12:
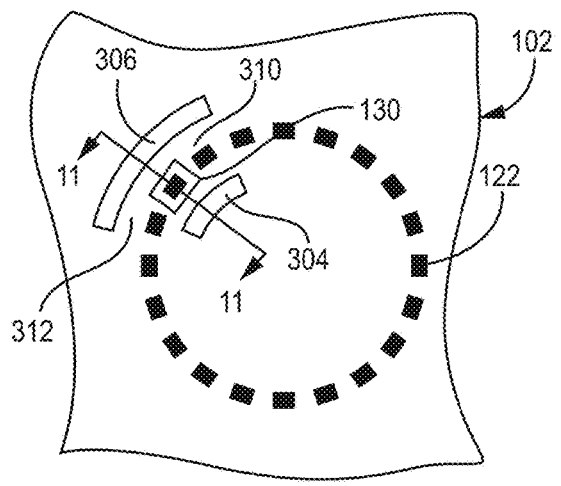
FIG. 12 is a top view of the embodiment of the silicon photonic filter chip of FIG. 11.

In an embodiment, and as depicted in FIGS. 11 and 12, thermal-isolating trench 300 does not entirely circumferentially surround ring resonator 122 so as to provide some connecting and supporting structure for resonator 122, heater 130, ring-temperature sensor 134 and thermally-isolated region. In the embodiment of FIGS. 11 and 12, thermal-isolating trench 300 extends circumferentially approximately 60°. In other embodiments, thermal-isolating trench 300 extends more than 60°, to provide further isolation, which may be beneficial for larger heaters. In an embodiment, thermal-isolating trench 300 extends circumferentially from 30° to 90°.

A second isolation trench design is with the trench fabricated only on one side of the ring waveguide, as illustrated by FIG. 13. This can be an appropriate design if there are other components on the other side of the ring waveguide, and a trench etch as shown in FIG. 11 is thus impractical. Referring to FIG. 13, an alternate thermal-isolation trench 300 that only includes a bottom and side portion is depicted. Thermal-isolation trench 300, in this embodiment, includes bottom portion 302 that extends underneath thermally-isolated region 310, and side portion 306 that extends adjacent and alongside thermally-isolated region 310.

Referring to FIG. 14, another alternate thermal-isolation trench 300 is depicted. In this embodiment, a portion of the silicon of thermally-isolated region 310 is left intact to support ring resonator 122. In this embodiment, thermal-isolation trench 300 includes bottom trench portions 302a and 302b, inside trench portion 304 and outside trench portion 306. This becomes a desirable trench design when a lengthy silicon etching process to completely remove the silicon underneath is impractical or when the mechanical stability without silicon support underneath becomes a concern, such as the design of FIG. 13.

Figure 15:
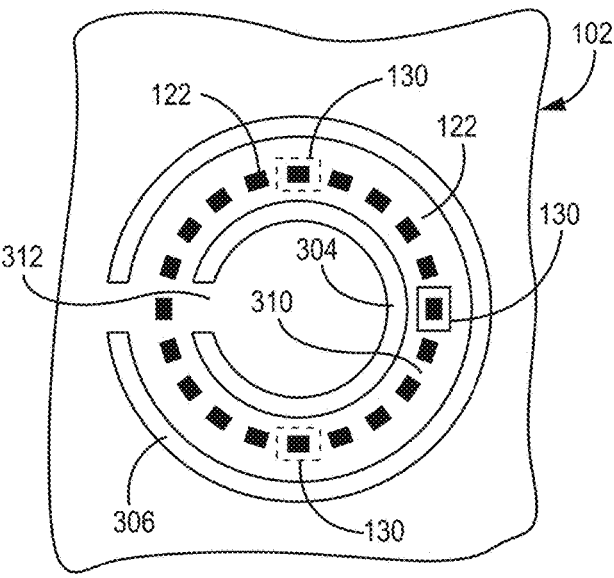
FIG. 15 is a top view of the embodiment of the silicon filter chip of FIG. 14 having the pair of thermal-isolating trenches.

In other embodiments, such as the one depicted in FIG. 15, thermal-isolating trench 300 and thermally-isolated region 310 may extend 360° around ring resonator 122, or in other embodiments mostly around the circumference, such as approximately 340° as depicted, to nearly form a complete ring, but will, in an embodiment have an arc length that is less than 360°. Such an embodiment may be useful to maximize thermal isolation, and may also be useful if additional heaters 130 are used. Further, a plurality of thermal-isolating trenches 300, each defining an arc length less than 360°, and having a combined arc length of less than 360° may be used, such as those depicted in FIG. 15.

With this silicon-on-insulator type of waveguide structure used for silicon photonic chips, under etching can be performed by etching through the silica cladding down to the silicon substrate. Then, a wet etch of vapor based etch can be directed to the silicon, which performs an under etch as the etching is continued. This processing is described further in Dong et al., "Thermally tunable silicon racetrack resonators with ultralow tuning power," Optics Express 2010, Vol. 18(19), 20298-20304, incorporated herein by reference.

SiPho ESL in a context suitable for the application of the current invention are discussed in more detail in the Section below directed to a specific prototype embodiment.

The temperature sensors can provide for frequency tuning as well as for providing thermal stability. Whether or not the SiPho chip thermal sensor is sufficient for providing thermal stability of the frequency, the frequency tuning involves adjustments of the temperatures at the ring resonators. Even though initially the frequencies may be correlated with the particular thermal output of the ring heaters, due to temporal changes, it can be beneficial to have local measurements to further adjust the laser output frequency.

For the maintenance of thermal stability, a closed-loop feedback control can be used. The measured temperature in the chip level temperature sensor can be evaluated by measuring the voltage at the RTD, which can then be processed with an analog analysis or a digital process, in which the analog voltage can be processed with an analog to digital converter. A microprocessor can be used to control the system. Implementation of the closed-loop based on a PID (proportional-integral-derivative) closed loop control are generally known. The control function has one term that is proportional, one term that is integral, and one term that involves the derivative. All of the terms do not need to be used. The PID controller can be used to adjust the voltage delivered to the heaters to maintain the chip temperature at a desired value to adjust for temperature fluctuations. The use of a PID controller to adjust optical components in a closed feedback loop is also described in published U.S. patent application 2008/0267631 to Collings et al., entitled "System and Methods for Multiple-Input, Multiple-Output Controller in a Reconfigurable Optical Network," incorporated herein by reference. Commercial temperature controller ships can be used, and PID implementing controllers are available from Omega Engineering, Inc. (Stamford, Conn., USA).

Specific Embodiment Design

FIG. 2 has a schematic view of the external cavity tunable laser using silicon photonic integrated circuit. It includes a gain medium chip and a silicon photonic (SiPh) optical filter chip. The gain section of the gain chip consists of InGaAsP based multiple quantum wells. The front facet of the gain chip is cleaved and serves as the laser output port. This air and III-V interface reflects 32% of the light back into the gain chip as the optical feedback. This facet of the gain chip can then be butt-coupled to the SiPho filter chip in an active alignment or passive flip-chip bonding process. The SiPho external cavity includes two cascaded ring resonator filters with slightly different transmission spectrum. The transmission spectrum of each ring resonator filter can be tuned through the integrated waveguide heater. By controlling the integrated heater powers on both ring resonator filters, the lasing mode can be selected over a large spectral range at the overlapping frequency of two transmission peaks of the two ring resonators. The light passing through two cascaded ring filters is then looped back into the gain medium chip to provide the laser optical feedback. A spot-size converter (SSC) based on, for example silicon nitride, can be used for mode size matching between the gain medium chip waveguide and SiPho chip waveguide.

Our designed silicon photonic chip comprises of two cascaded ring resonators and a phase control section in a loop-back configuration as shown in FIG. 2. The two rings can have a nominal free-spectral range (FSR) of 300 GHz and 310 GHz respectively. The thermal tuning deliberately adjusts each of those independently over a range of several tenths of a percent. The FSR and operating wavelength determine the physical size of the ring, and for the prototype SiPho chip the rings had roughly 120-130 micron diameters.

If the common resonating frequency is set to 195,300 GHz (wavelength of approximately 1535 nanometers), then the 300 GHz ring will be resonating at an order of 651 and the 310 ring will be resonating at an order of 630: 300*651=310*630=195300. The rings then each also resonate at orders ±n from the cited order, but the cited orders are the only ones where they strongly overlap at a common frequency. A typical FWHM of the resonant peak would be about 10 GHz. So the finesse of each ring would be (310, 300)/10~30. Roughly this value of finesse means that a typical resonant photon will circulate in each ring an average of 30 times before moving on. This also means that the "Q" value (resonator quality) of each ring is approximately 195300/10~20,000.

The free spectral ranges (FSRs) of these two ring resonators are slightly different to provide a large tuning range of 65 nm through the Vernier effect. The coupling ratio between the ring resonators and the bus waveguide was carefully optimized to have low insertion loss and narrow filter passbands. This enables a sufficiently large side mode suppression ratio (SMSR) for stable single-mode lasing. Thin-film heaters were fabricated on top of each ring waveguide and the phase control section, with measured $2\pi$ power of about 50 mW for both ring resonators. We used high-efficiency and high-saturation-power gain chips and SOAs, essentially as used in existing ECL products.

Figure 16:
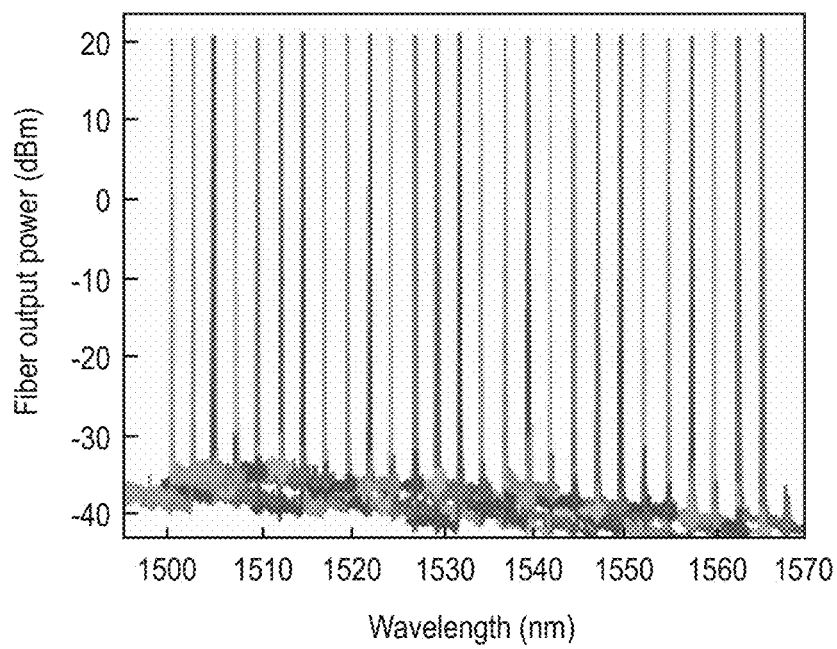
FIG. 16 is a plot of superimposed lasing spectra tuned across 65 nm wavelength range using the prototype ECL with varying a single heater associated with one ring resonator.
Figure 17:
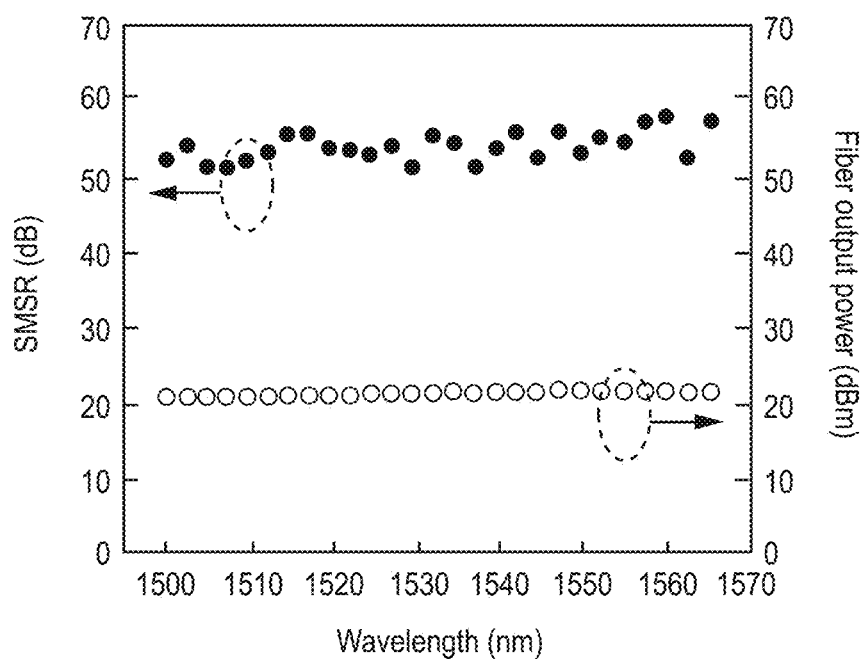
FIG. 17 is a plot of measured SMSR (upper plot of dots) and fiber-coupled output power (lower plot of dots) across the tuning range.

The prototype device was tested for its performance. The assembled silicon photonic tunable laser was mounted on a thermo-electric cooler (TEC) to keep the device at a constant temperature. The current injected into the gain chip was kept constant at 200 mA for all of the following experiments. The injection current for SOA can be varied to control the laser output power. FIG. 16 shows the superimposed spectra of 27 wavelength channels tuned over 65 nm by heating one of the ring resonators only. If both ring resonator heaters are controlled, one can tune the lasing wavelength continuously across the tuning range. In this measurement, the SOA current was set at 900 mA, and the measured fiber-coupled output power ranges from 21.5 to 21.8 dBm across the C-band, as shown by the dots in the lower curve in FIG. 17. Such high output power is promising to compensate for the transmitter loss using complex modulation formats. Large SMSR (side mode suppression ratio) over 50 dB was also obtained at each wavelength channel, as shown by the dots in the upper curve in FIG. 17.

Figure 18A:
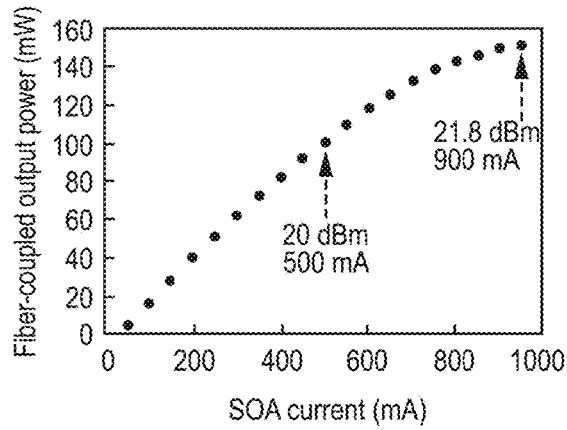
FIG. 18 has a left side plot (a) showing fiber-coupled output power as a function of the SOA current, with gain chip current fixed at 200 mA, and a right side plot (b) showing measured laser intrinsic linewidth (upper dots) and relative intensity noise (RIN, lower dots) as a function of. SOA current.
Figure 18B:
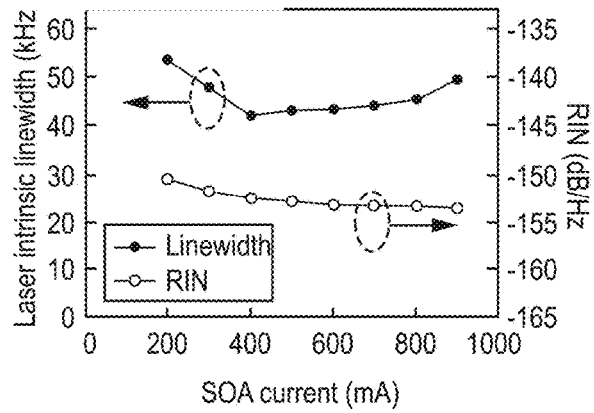
Figure 19A:
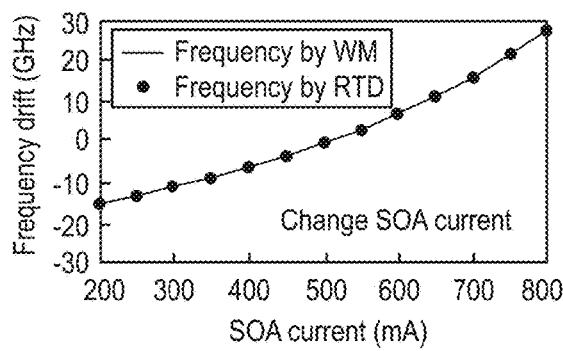
FIG. 19 is a set of plots: (a) is a plot of frequency measured by a wavelength meter (line) and calculated by the RTD reading (dots) for different SOA currents, using the prototype device, (b) is a plot of the measurement errors from the results in plot (a), which are within ±0.2 GHz, plot (c) is a plot of frequency measured by a wavelength meter (line) and calculated by the RTD reading (dots) for different ring heater temperature setting, and (d) is a plot of the measurement error from plot (c), which are within ±0.2 GHz.
Figure 19B:
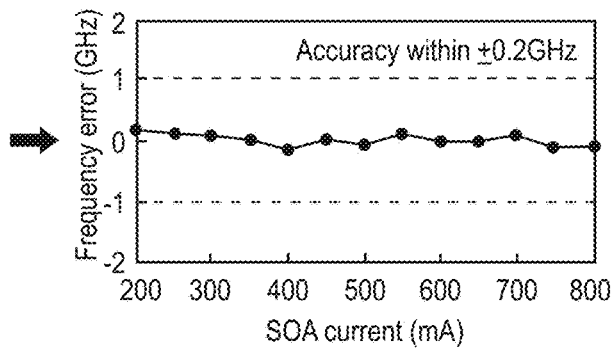
Figure 19C:
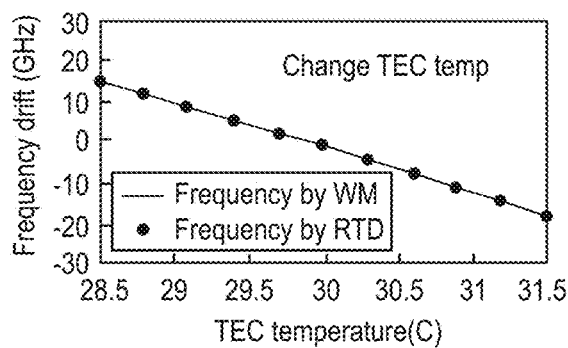
Figure 19D:
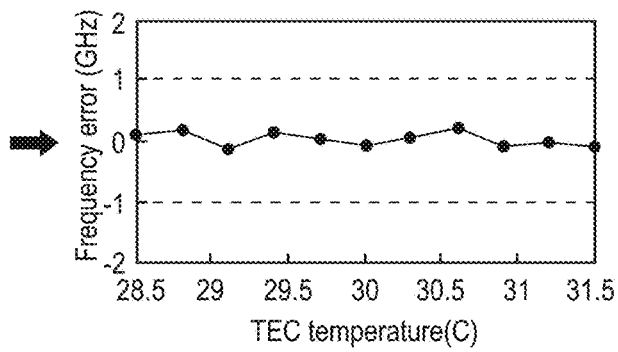

The prototype was used to study the SOA current dependence of the output power, spectral linewidth, and relative intensity noise (RIN). Plot (a) of FIG. 18 shows the fiber-coupled output power at 1547.0 nm, as a function of the SOA current. The plot indicates that the output power reaches 100 mW at 500 mA SOA current. When the SOA current increases further to 700 mA, the booster SOA starts to saturate gradually. The maximum output power reaches what is believed to be a record-high level of 150 mW at 950 mA SOA current. Also, the laser spectral linewidth and RIN were measured. We used a frequency discriminator approach to measure the intrinsic laser linewidth, as taught in V. Michaud-Belleau et al., "Passive Coherent Discriminator Using Phase Diversity for The Simultaneous Measurement of Frequency Noise and Intensity Noise of A Continuous-Wave Laser," Metrologia 53, 1154 (2016), incorporated herein by reference. It employs a coherent delay-line interferometer to convert laser frequency noise into intensity fluctuations, which can then be measured by a photodetector. The frequency noise baseline between 100 and 400 MHz was used to estimate the intrinsic Lorentzian linewidth, avoiding contributions from 1/f thermal and electronics noise at lower frequencies. The upper dots in plot (b) of FIG. 18 show the measured linewidths at 1547.0 nm. Note that there is no obvious linewidth deterioration even with SOA current increasing up to 900 mA. Indeed, at SOA working currents between 200 and 900 mA, the linewidths are well below 60 kHz. Linewidths of two other wavelengths at the beginning and end of the C-band were also tested, both yielding linewidths narrower than 80 kHz (data not shown here). While such narrow linewidths are suitable for 16 or 64 QAM modulation formats, further improvement if needed can be expected from optimizing the silicon photonic chip layout. The lower plot of dots in plot (b) of FIG. 18 show the relationship between the laser RIN and the SOA current. The measured low RIN are below −150 dB/Hz (averaged from 0.1 to 10 GHz) for SOA currents between 200 and 900 mA.

The lines in FIG. 19 plots (a) and (c) show the frequency drift due to SOA current change or TEC temperature setting change. The dots show the frequency estimated by the reference RTD, which gives a low measurement error within ±0.2 GHz. The corresponding frequency errors are plotted in plots (b) and (d) of FIG. 19. This demonstrates that the RTD can track accurately the lasing wavelength drift from external thermal disturbances such as SOA current change or package temperature change.

Figure 20:
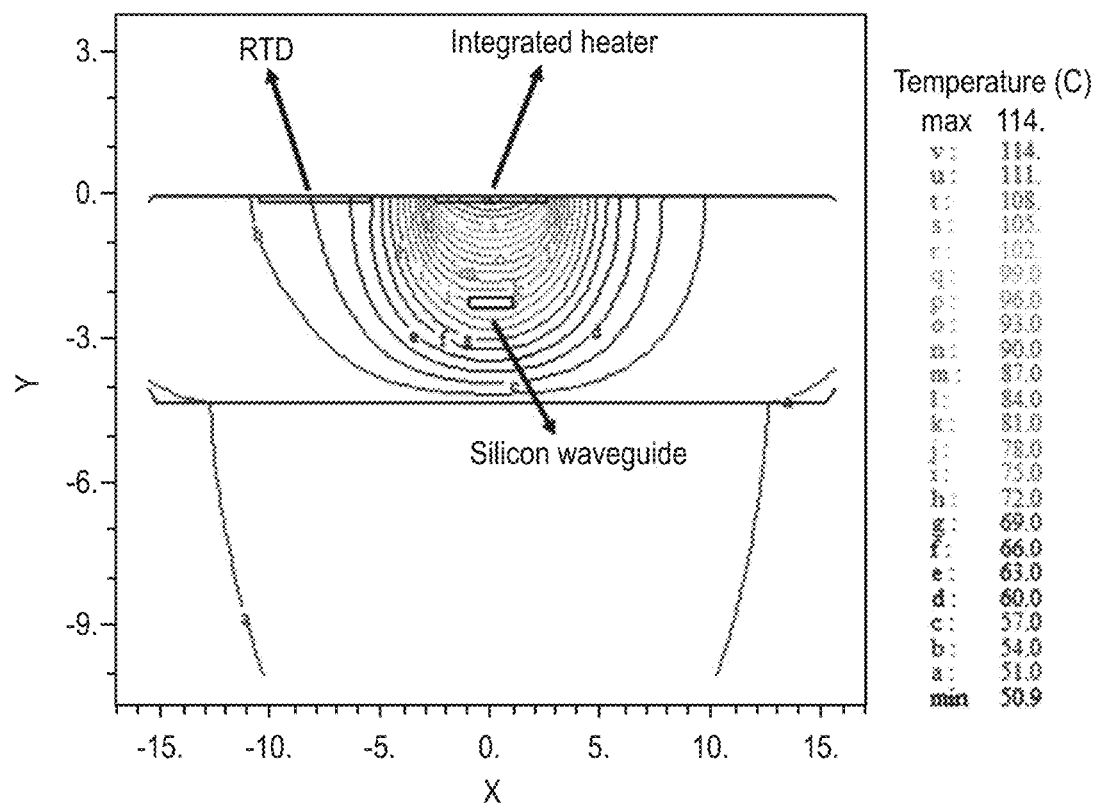
FIG. 20 is a plot of temperatures form a model showing the thermal gradients around a silicon waveguide with a resistance heater set at a temperature of 114° C.

For the prototype device, simulation results for the temperature gradient around the waveguide and heater are shown in FIG. 20. As illustrated by the simulation results in FIG. 20, when the RTD is separated from the silicon ring resonator by the upper silicon dioxide cladding of 2 micron thickness, its temperature rises by 17° C. while the ring resonator waveguide rises by 31° C. as the integrated heater is heated up. The implications of the less than 100% temperature sensitivity are discussed generally above.

Figure 21:
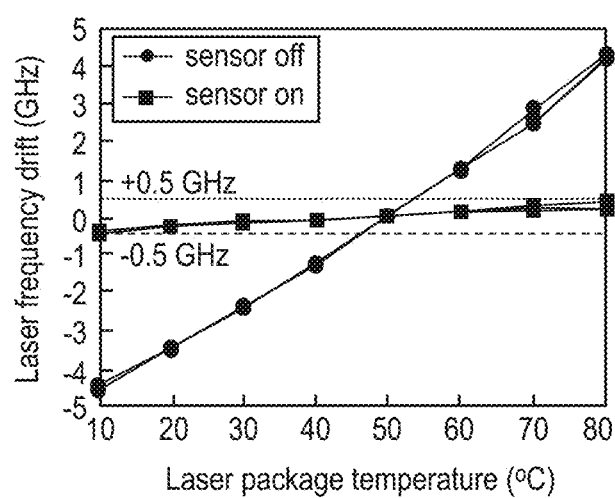
FIG. 21 is a plot of laser frequency drift as a function of device temperature drift with different lines plotted with and without operation of the chip temperature sensor showing the reduction of temperature drift possible with the use of the chip temperature sensor.
Figure 22:
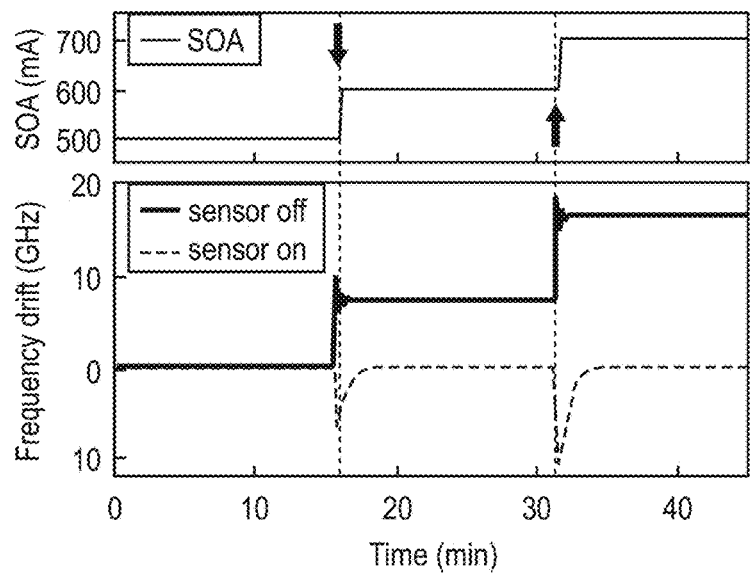
FIG. 22 is a plot in the lower frame of frequency drift as a function of time where the current to a semiconductor optical amplifier is increased in two steps from 500 mA to 700 mA, as shown in the top frame, and the frequency drift is shown with and without the operation of the chip temperature sensor.

As illustrated by the round dots in FIG. 21, without this reference chip RTD, the lasing frequency drifts by as large as 4 GHz with the ambient temperature variations between 10° C. and 80° C. To the contrary, with the reference chip RTD function enabled, the frequency drifts can be reduced by about one order of magnitude. The measured frequency errors can be within ±0.5 GHz, smaller than the frequency error specification of ±1 GHz, which are plotted in square dots in FIG. 16. As illustrated in FIG. 22, a thermal disturbance in the common silicon substrate can be introduced by increasing the SOA current from 500 mA to 600 mA, and then to 700 mA (shown by the two arrows in the top frame of the figure). Such SOA current changes are required for laser output power tuning, but produce temperature variation on the photonic integrated chip. As shown by the solid line in the bottom frame of FIG. 21, if the integrated chip RTD function is disabled, the lasing frequency drifts by 7.3 GHz, and then another 7.0 GHz, all with the TEC turned on to stabilize the chip temperature. When the chip RTD function is enabled in the control loop, as shown by the dashed line in the bottom frame of FIG. 22, the lasing frequency can be stabilized back to the original spectral location. The frequency error with integrated chip RTD turned on is well below ±1 GHz frequency error specification. The observed two frequency dips were from the PID controller overshoot, which can be corrected by further optimizing the controller parameters. Note that such laser frequency stability against temperature change was obtained through our integrated sensor technology, without the use of any external instruments such as an optical spectrum analyzer (OSA) (as used in H. Guan et al., "Widely-tunable, narrow-linewidth III-V/silicon hybrid external-cavity laser for coherent communication," Opt. Express 26, 7920-7933 (2018), incorporated herein by reference) or extra wavelength lockers.

Figure 23:
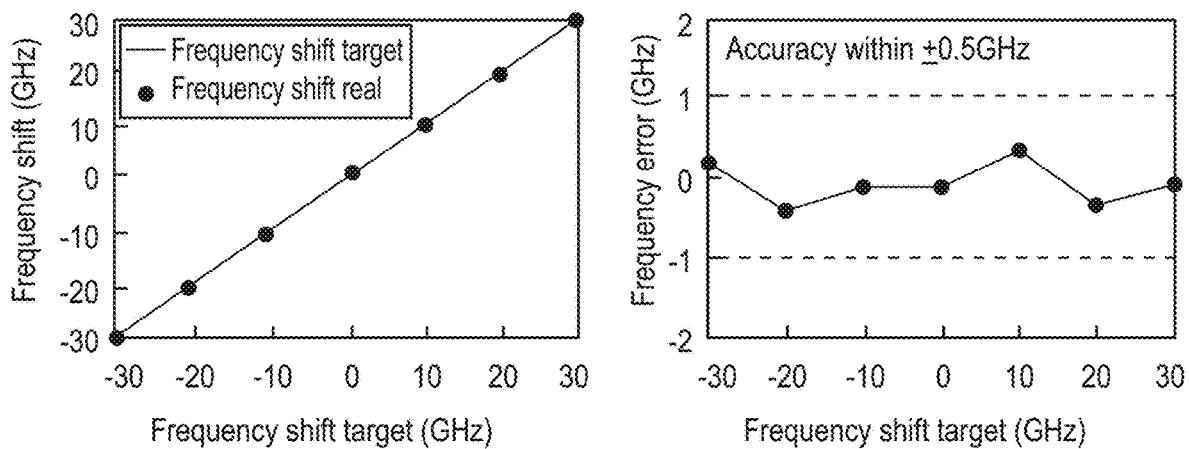
FIG. 23 is a plot in the left frame of the accuracy of frequency tuning obtained by adjusting the heater temperature, in which the line is a plot of the target frequency and the dots are a plot of the measured frequency from a wavelength meter for the prototype device, and the right frame is a plot of the frequency error from the left plot showing the error is within ±0.5 GHz by using the heater powers only.

As the frequency drift from thermal disturbance can be accurately tracked, the filter heater powers can then be adjusted accordingly to compensate and tune to any target frequency accurately. FIG. 23 shows the relationship between the target frequency shift and the real frequency shift after tuning the heater powers. For a target frequency shift between −30 and 30 GHz, the frequency tuning shows less than ±0.5 GHz error. This is within our spec of ±1 GHz frequency tuning accuracy for SiPho ECL.

Figure 24:
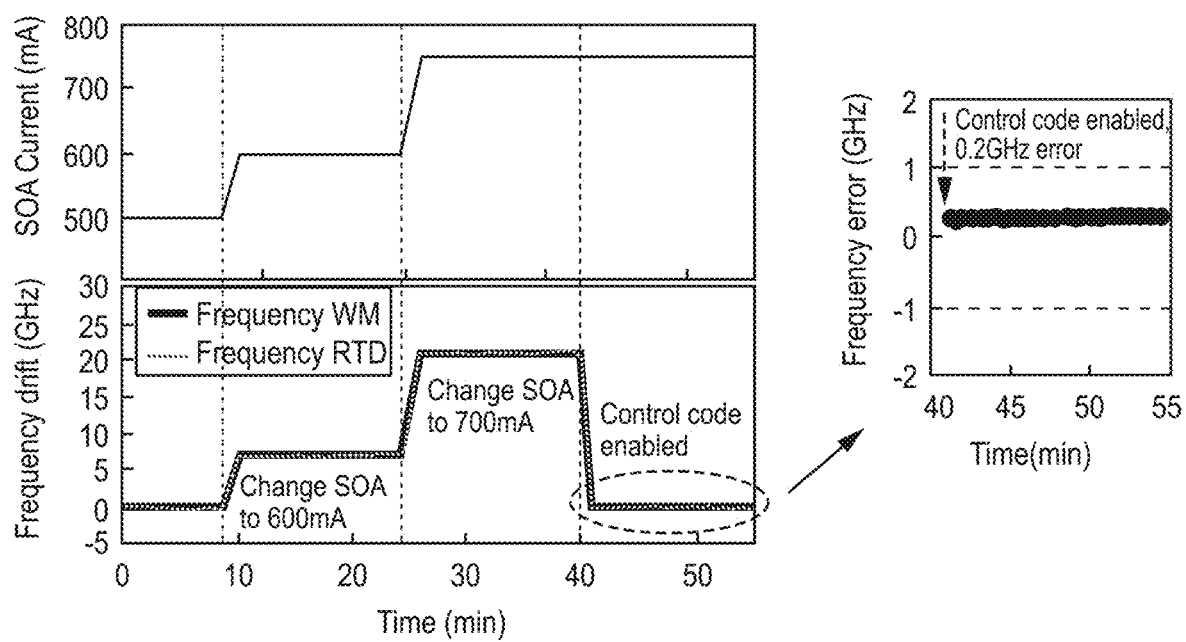
FIG. 24 has a plot of SOA voltage as a function of time in the upper left plot, a plot in the lower left frame of the frequency drift as a function of time due to SOA current change (first line), which is accurately tracked by using a single reference RTD (second line, overlapping the first), with the difference as a function of time plotted in the fright frame, in which at time of 40 min, the control code is enabled and shift the frequency to original spectral position with only 0.2 GHz error.

FIG. 24 shows a frequency stabilization experiment to demonstrate the feasibility of this control approach by using a single reference RTD and two filter heaters. At time around 9 min and 24 min, the SOA current was changed to 600 mA and then 750 mA, which gives certain thermal disturbance to the silicon photonic chip. The SOA voltage as a function of time is plotted in the upper right frame of FIG. 24. Referring to the lower right frame of FIG. 24, the change in SOA voltage results in a lasing frequency drift up to 20 GHz (first line). Such frequency drift was accurately tracked by the reference RTD (second line, which cannot be distinguished from the first line in the resolution of the plot). At time of 40 min, the control code was enabled, which tuned the frequency back to the original spectral position with only 0.2 GHz error. The frequency error is plotted in the right frame as a function of time. These results demonstrate that the lasing frequency can be stabilized against thermal disturbance and then be tuned to any target frequency accurately by calibrating and tuning the heater powers only, without the knowledge of filter local temperatures.

Besides the superior performance, most of the packaging and testing processes as well as the control electronics and gain chips of this silicon photonic laser are leveraged from our mature commercial products. We therefore believe this prototype device, optionally with further adaptation, has a great potential towards high-volume productions.

In this work, we have demonstrated a high-performance hybrid-integrated silicon photonic tunable laser with a record-high fiber output power of over 140 mW by using an integrated high-saturation-power booster SOA. We have obtained spectral linewidths narrower than 80 kHz and RIN below −150 dB/Hz, suitable for high-order modulations. The integration of a booster SOA shows no degradation of the laser spectral linewidth and RIN. Our developed integrated sensor technology for the silicon photonic chip also enables precise frequency control down to sub-1 GHz. We have further demonstrated the feasibility of this silicon photonic tunable laser for coherent applications.

The embodiments above are intended to be illustrative and not limiting. Additional embodiments are within the claims and inventive concepts. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated. The use of the term "about" herein refers to measurement error for the particular parameter unless explicitly indicated otherwise.

What is claimed is:

1. A tunable solid state laser device comprising:
a semiconductor-based gain chip; and
a silicon photonic filter chip with tuning capability, wherein silicon photonic filter chip comprises an input-output silicon waveguide, at least two ring resonators formed with silicon waveguides, one or more connecting silicon waveguides interfacing with the ring resonators, a separate heater associated with each ring resonator, a temperature sensor configured to measure a chip temperature, and a controller connected to the temperature sensor and the separate heaters and programmed with a feedback loop to maintain a filter temperature to provide a tuned frequency, wherein the one or more connecting silicon waveguides are configured to redirect light resonant with each of the at least two ring resonators back through the input-output silicon waveguide,
wherein the input-output silicon waveguide of the silicon photonic filter chip is coupled to the semiconductor-based gain chip with a spot size convertor to provide for mode size matching to reduce loss due to an interface,
wherein the silicon photonic filter chip further comprises a separate resistance temperature sensor associated with each ring resonator, wherein the controller is connected to receive a signal from each separate resistance temperature sensor to account for one or more temperature measurements in the feedback loop, and
wherein each separate resistance temperature sensor comprises either:
thin metal films deposited proximal to corresponding ring resonators and separated from the corresponding ring resonators by a silicon dioxide cladding layer, or
doped silicon adjacent to and on a same silicon device layer as the corresponding ring resonators.

2. The tunable solid state laser device of claim 1, wherein the silicon photonic filter chip comprises an optical splitter-combiner optically connected to the input-output silicon waveguide and wherein the one or more connecting silicon waveguides comprise two branch waveguides disposed with a loop of a Sagnac interferometer each connected to a split side of the optical splitter-combiner and wherein the ring resonators close the loop of the Sagnac interferometer to form a multi-filtered Sagnac interferometer.

3. The tunable solid state laser device of claim 2, wherein the at least two ring resonators are two ring resonators, wherein the one or more connecting silicon waveguides further comprise a generally U-shaped silicon waveguide configured to connect optically the two ring resonators to each other and wherein each ring resonator is respectively coupled to a branch of the optical splitter-combiner to form a configuration wherein light traveling from a splitter-coupler couples into a first ring resonator, along the generally U-shaped silicon waveguide and then along the other ring resonator and coupled into another branch from the splitter-combiner toward the splitter-coupler, if the light is appropriately in resonance with both ring resonators.

4. The tunable solid state laser device of claim 2, wherein the at least two ring resonators are three ring resonators, wherein two of the three ring resonators are respectively coupled to a branch of the splitter-combiner, and wherein a third ring resonator is positioned between and optically connected to the other two ring resonators to form a configuration wherein light traveling from a splitter-coupler couples into a first ring resonator from a branch, along the third ring resonator and then along another ring resonator of the at least two ring resonators and coupled into another branch to complete the loop of the Sagnac interferometer with light directed toward the splitter-coupler, if the light is appropriately in resonance with all three ring resonators.

5. The tunable solid state laser device of claim 1, wherein a trench in a cladding thermally isolates at least part of the separate heater and the at least two ring resonators.

6. The tunable solid state laser device of claim 1, wherein the semiconductor-based gain chip comprises a p-n diode comprising III-V semiconductor layers.

7. The tunable solid state laser device of claim 1, wherein the controller is programmed to perform proportional-integral-derivative closed loop control of a temperature of the ring resonators.

8. The tunable solid state laser device of claim 1, further comprising a semiconductor optical amplifier configured to receive an output of the semiconductor-based gain chip and further output an amplified optical signal.

9. The tunable solid state laser device of claim 1, further comprising a semiconductor optical amplifier configured to receive an output of the semiconductor-based gain chip and further output an amplified optical signal and a thermoelectric cooler configured to cool components, wherein the silicon photonic filter chip comprises an optical splitter-combiner optically connected to the input-output silicon waveguide and wherein the one or more connecting silicon waveguides comprise two branches of a Sagnac interferometer each connected to a split side of the optical splitter-combiner and wherein the ring resonators close a loop of the Sagnac interferometer to form a multi-filtered Sagnac interferometer.

10. A method to stabilize output of a tunable external cavity laser, wherein the tunable external cavity laser comprises a semiconductor-based gain chip and a silicon photonic filter chip that are coupled to each other with a spot size converter to form the tunable external laser cavity, wherein the silicon photonic filter chip comprises a resistance temperature sensor configured to measure chip temperature away from any heating elements and a plurality of ring resonators with separate integrated resistance heaters,
wherein the silicon photonic filter chip further comprises a separate resistance temperature sensor associated with each of the plurality of ring resonators, and
wherein each separate resistance temperature sensor comprises either:
thin metal films deposited proximal to corresponding ring resonators and separated from the corresponding ring resonators by a silicon dioxide cladding layer, or
doped silicon adjacent to and on a same silicon device layer as the corresponding ring resonators, the method comprising:
obtaining one or more readings from the resistance temperature sensor;
receiving one or more signals from the separate ring temperature sensors; and
using a control loop driven with a controller to adjust power to resistance heaters to maintain laser frequency within tolerances and accounting for temperature measurements associated with at least one of the one or more readings and the one or more signals.

11. The method of claim 10, wherein the control loop performs a proportional-integral-derivative adjustment of the resistance heaters.

12. The method of claim 10, wherein the tunable external cavity laser further comprises a controller comprising a digital processor.

13. The method of claim 10, wherein a tolerance of the laser frequency is ±0.5 Ghz.

14. The method of claim 10 wherein the silicon photonic filter chip comprises an input waveguide, two branch waveguides, a splitter-coupler connected to the input waveguide and the two branch waveguides, and at least two ring resonators bridging between the two branched waveguides and wherein the ring resonators close a loop of an interferometer to form a multifiltered Sagnac interferometer.

15. The method of claim 10, wherein the tunable external cavity laser further comprises a semiconductor optical amplifier configured to receive output from the semiconductor-based gain chip and to output amplified light.

16. The method of claim 15, wherein the tunable external cavity laser has a power output of at least about 120 mW and an intrinsic linewidth of no more than about 60 kHz.

17. An optical chip comprising:
an input waveguide;
a Sagnac interferometer optically connected to the input waveguide, comprising:
a splitter-coupler connected to the input waveguide;
two waveguide branches connected to the splitter-coupler and that each terminate at an end; and
two ring resonators each coupled to a separate waveguide branch and to each other through an intervening curved waveguide; and
a resistance heater associated with each ring resonator,
wherein the optical chip is configured to split input light into a particular waveguide branch and couple split light through one ring resonator, along the intervening curved waveguide and through the other ring resonator into an opposite waveguide branch back toward the splitter-coupler if the split light is in resonance with the two ring resonators and any intervening ring resonators,
wherein the optical chip further comprises a separate resistance temperature sensor associated with each ring resonator, wherein a controller is connected to receive a signal from each separate ring temperature sensor to account for one or more temperature measurements in a feedback loop, and
wherein separate resistance temperature sensors comprise either:
thin metal films deposited proximal to corresponding ring resonators and separated from the corresponding ring resonators by a silicon dioxide cladding layer, or
doped silicon adjacent to and on a same silicon device layer as the corresponding ring resonators.

18. The optical chip of claim 17, wherein the input waveguide comprises elemental silicon and silica cladding.

19. The optical chip of claim 18, wherein the intervening curved waveguide is U-shaped with opposite straight edges of the intervening curved waveguide interfaced with the corresponding ring resonators.

20. The optical chip of claim 19, further comprising a temperature sensor positioned to measure chip temperature without significant measurement of thermal gradients from each resistance heater.

21. The optical chip of claim 17, further comprising a trench providing at least partial thermal isolation of a heated portion of the corresponding ring resonator and each waveguide.

22. The optical chip of claim 17, wherein the controller is programmed to perform proportional-integral-derivative closed loop temperature control of each ring resonator.

23. The optical chip of claim 17, wherein each separate resistance temperature sensor comprises the doped silicon.

* * * * *